(12) United States Patent
Bae et al.

(10) Patent No.: US 7,814,441 B2
(45) Date of Patent: Oct. 12, 2010

(54) SYSTEM AND METHOD FOR IDENTIFYING ORIGINAL DESIGN INTENTS USING 3D SCAN DATA

(75) Inventors: Seockhoon Bae, Cupertino, CA (US); Donghoon Lee, Seoul (KR); Changyoon Yang, Sungnam (KR)

(73) Assignee: INUS Technology, Inc., Seoul (KR)

( * ) Notice: Subject to any disclaimer, the term of this patent is extended or adjusted under 35 U.S.C. 154(b) by 512 days.

(21) Appl. No.: 11/612,294

(22) Filed: Dec. 18, 2006

(65) Prior Publication Data

US 2008/0040080 A1 Feb. 14, 2008

Related U.S. Application Data

(60) Provisional application No. 60/767,514, filed on May 9, 2006.

(51) Int. Cl.
*G06F 17/50* (2006.01)
(52) U.S. Cl. .................. 716/1; 703/1; 700/98; 345/420
(58) Field of Classification Search ..................... 716/1; 703/1; 100/98; 345/420
See application file for complete search history.

(56) References Cited

U.S. PATENT DOCUMENTS

| | | | | |
|---|---|---|---|---|
| 6,064,759 A | * | 5/2000 | Buckley et al. | 382/154 |
| 6,129,872 A | * | 10/2000 | Jang | 264/75 |
| 6,256,038 B1 | * | 7/2001 | Krishnamurthy | 345/419 |
| 6,788,210 B1 | * | 9/2004 | Huang et al. | 340/612 |
| 2003/0052893 A1 | * | 3/2003 | Sawada | 345/589 |
| 2005/0134586 A1 | | 6/2005 | Koo et al. | |

* cited by examiner

*Primary Examiner*—Naum B Levin
(74) *Attorney, Agent, or Firm*—Lahive & Cockfield, LLP; John S. Curran

(57) ABSTRACT

Programmatic extraction and management of solid and surface modeling parameters from raw 3D scan data is discussed. An automated process reads raw 3D scan data and works in communication with a CAD system able to perform CAD part modeling. The user is provided with an automatic function to segment a mesh model (formed from the raw 3D scan data) into dozens of mesh regions. A graphical user interface is provided which enables a user to choose a type of the design intent along with the mesh regions from which the design intent is calculated. Each design intent is represented in a vector, a plane or a poly-line depending upon the type of design intent. In response to a user demand for the parameters of a modeling feature, a best approximation of the requested parameter value is calculated by processing the raw 3D scan data using a set of functions.

22 Claims, 23 Drawing Sheets

SYSTEM AND METHOD FOR IDENTIFYING ORIGINAL DESIGN INTENTS USING 3D SCAN DATA

FIELD OF THE INVENTION

The illustrative embodiment of the present invention relates generally to CAD (Computer Aided Design) and more particularly to reverse engineering 3D scan data to identify original design intents during a part redesign process.

BACKGROUND

Computer Aided Design (CAD) applications are used to produce computer models of two and three dimensional objects as part of the production process for the actual physical device being modeled. The models frequently include multiple parts which must be individually designed. The designer of the model parts may use specialized modeling features in order to design the model parts. Exemplary modeling features (which may be referred to as design intents) include extrusion, revolving, shelling, filleting, sweeping, lofting, blending, embossing, pattern copying, etc. The design intents may be parameterized and the model designer frequently experiments with different parameter values for the design intents during the design process. Once the designer is satisfied with the design, the actual physical device may be produced using the model.

3D scanning captures physical geometry information for a three-dimensional object by gathering high resolution points representing the shape of the scanned three-dimensional object. Once captured, the raw 3D scan data may be converted to a CAD part model for further processing to replicate or modify the design of the three-dimensional object. This procedure of capturing 3D scan data for a three-dimensional object in order to provide it to a CAD application so that the object may be redesigned is referred to as reverse engineering.

Unfortunately, the raw scan data captured by a 3D scanner during a reverse engineering process only represents a final geometry of the object. The fact that the 3D scan data only represents a final geometry of the object makes it difficult to retrace the original design intents and their parameter values. For example, it is difficult to determine from 3D scan data original design intents and their parameter values for features such as an extrusion 2D profile, a direction and distance, a revolving 2D profile, an axis and angle, a constant or varying filleting radii, a drafting plane and its angle, sweeping path curves, center lines of curved pipes, etc. The inability to determine the original design intents leads to the reverse engineering process being less precise and productive. It would be desirable to provide a computerized process working with a CAD system that programmatically assists the user in exploring and calculating key original design intents using raw 3D scan data.

BRIEF SUMMARY

The illustrative embodiment of the present invention enables a user to programmatically extract and manage solid and surface modeling parameters from raw 3D scan data. An automated process reads raw 3D scan data and works in communication with a CAD system able to perform CAD part modeling. The user is provided with an automatic function to segment a mesh model (formed from the raw 3D scan data) into dozens of mesh regions by estimating geometric values such as mesh normal or curvature values. A graphical user interface is provided which enables a user to choose a type of the design intent along with one or more mesh regions from which the design intent is calculated. Some design intents may also be found programmatically for well-shaped feature regions. Each design intent is represented in a vector, a plane or a poly-line depending upon the type of design intent. Additionally, in response to a user demand for the parameters of a modeling feature, a best approximation of the requested parameter value is calculated by processing the raw 3D scan data using a set of functions. The user can then use the approximated value or modify the value manually.

In one aspect of the present invention a method for approximating original design intents during reverse engineering using 3D scan data includes the step of providing a collection of 3D scan data representing the shape of a three-dimensional object. The 3D scan data is combined into multiple meshes that are combined into a mesh model representing the three-dimensional object. The method also segments the mesh model with a segmentation facility into multiple mesh regions. Additionally, the method selects a mesh region and a type of design intent, the design intent being an original design feature. An approximate value for the selected type of design intent for the selected mesh region is calculated programmatically. The calculating uses the 3D scan data for the selected mesh region.

In another aspect of the present invention a system for approximating original design intents using 3D scan data includes a segmentation facility. The segmentation facility programmatically segments a mesh model that is formed from 3D scan data of a three dimensional object into multiple mesh regions. The system also includes a user interface that enables the selection of a mesh region and a type of design intent. The design intent is an original design feature. Additionally, the system includes a a design intent facility in communication with a Computer Aided Design (CAD) application. The design intent facility programmatically calculates an approximate value for the selected type of design intent for the selected mesh region. The 3D scan data for the selected mesh region is used in calculating the approximate value for the selected type of design intent.

BRIEF DESCRIPTION OF THE DRAWINGS

The invention is pointed out with particularity in the appended claims. The advantages of the invention described above, as well as further advantages of the invention, may be better understood by reference to the following description taken in conjunction with the accompanying drawings, in which:

DETAILED DESCRIPTION

The illustrative embodiment of the present invention provides a user with tools to approximate original model design intents while reverse engineering a three-dimensional object from 3D scan data. An automated process allows a user to target particular mesh regions and specify the particular type of original design feature for which the user is interested in obtaining a parameter value. The present invention programmatically analyzes the underlying mesh data in order to infer the original design intent and present the user with a best estimation as to a value for the original design intent. The user is then able to use the approximation or modify it as required while creating solid model parts.

Figure 1:
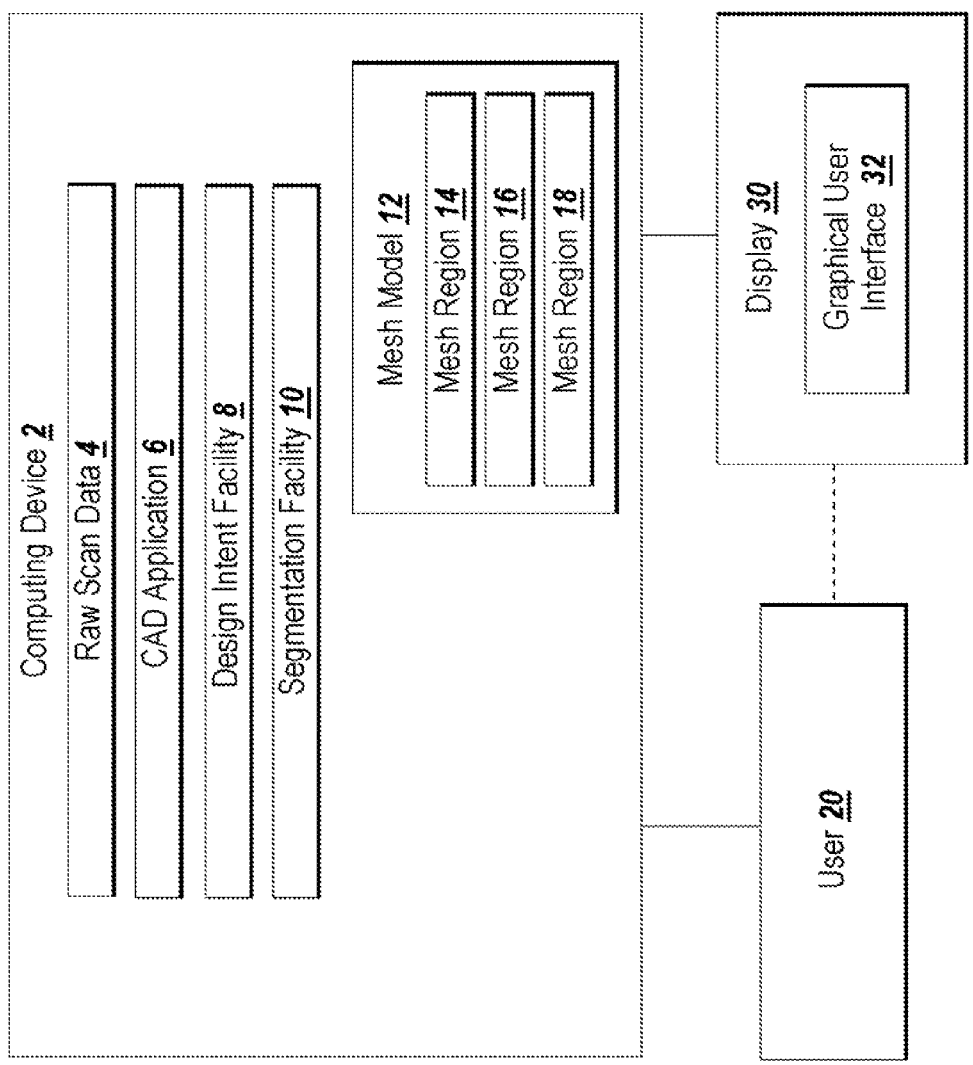
FIG. 1 depicts an environment suitable for practicing the illustrative embodiment of the present invention.

FIG. 1 depicts an environment suitable for practicing the illustrative embodiment of the present invention. A computing device 2 includes a collection of raw 3D scan data 4 for a scanned three-dimensional object. The raw 3D scan data 4 is collected from a three-dimensional scanner. The computing device 2 also hosts a CAD application 6, a design intent facility 8 and a segmentation facility 10. The computing device 2 may be a workstation, server, laptop, mainframe, PDA, a cluster of devices operating together, a virtual device or another computing device able to support the CAD Application 6, design intent facility 8 and segmentation facility 10 discussed herein. The design intent facility 8 and the segmentation facility 10 are executable software processes that are explained further below. The design intent facility 8 and segmentation facility 10 may be implemented as application processes, application plug-ins or stand-alone applications. In one implementation of the present invention, the design intent facility 8 is integrated into the CAD application 6 as a tool. In another implementation, the design intent facility 8 is in communication with the CAD application 6 but is not part of the CAD application. In another implementation, the segmentation facility is part of the design intent facility 8.

The raw scan data 4 is a collection of high resolution points in three dimensions representing the shape of a scanned object. In one implementation, the raw scan data 4 is a set of triangular meshes but the use of other forms of scan data is also considered to be within the scope of the present invention. For example, the raw scan data 4 may be points, quad meshes, tetrahedral meshes or hexahedral meshes. Collectively the set of meshes form a mesh model representing the surface of the scanned object. Tire segmentation facility 10 allows a user to programmatically segment the mesh model 12 into mesh regions 14, 16 and 18 according to curvature values. It will be recognized that the more curved segments of the mesh model result in a greater number of meshes so as to deliver the illusion of a smooth surface. The design intent facility 8 generates a graphical user interlace (GUI) 32 on a display 30 in communication with the computing device 2. The GUI 32 enables a user 20 to select a particular mesh region 12, 14 and 16 in the mesh model and a particular type of design intent for which the user would like to calculate the original parameter value. The design intent facility 8 analyzes the raw scan data 4 with a set of functions as set forth further below and calculates an approximate value for the design intent requested by the user 20.

Figure 2:
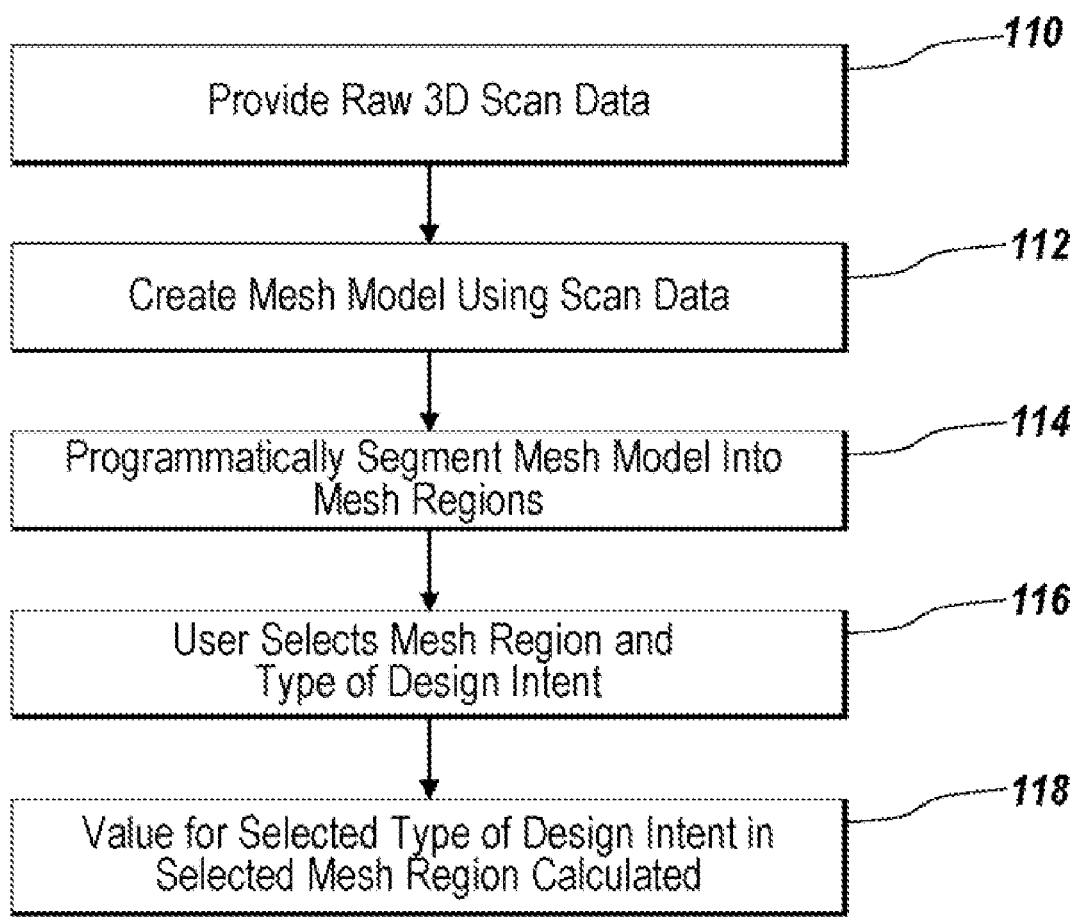
FIG. 2 is a flowchart of a sequence of steps followed by an embodiment of the present invention to identify original design intents using raw 3D scanned data.

FIG. 2 is a flowchart of a sequence of steps followed by an embodiment of the present invention to identify original design intents using raw 3D scan data. The sequence of steps begins with the provision of a collection of raw 3D scan data 4 (step 110). The raw 3D scan data may be gathered as a dynamic part of the process of determining a design intent or may be previously stored scan data. A mesh model 12 is created from the scan data 4 if the data has not previously been combined into a model (step 112). The segmentation facility 10 may be utilized in response to a user command to programmatically segment the mesh model 12 into multiple mesh regions 14, 16 and 18 (step 114). The design intent facility may then find some design intents automatically from regions where features are well preserved. A user 20 viewing the mesh model 12 on the display 30 may then use a GUI 32 to select one or more mesh regions 14, 16 and/or 18 and a type of design intent for which he wishes the design intent facility 8 to calculate an approximation of the original design parameter value (step 116). The design intent facility 8 then analyzes the raw scan data 4 as set forth further below to calculate a value for the type of design intent for the selected mesh region 14, 16 and/or 18 (step 118).

As noted above, the present invention allows a user to select a mesh region for which the user desires the design intent facility 8 to determine a value for an original design intent. In order to better explain the present invention, the determination of a number of different types of design intents will be discussed. It will be appreciated that the list discussed below is meant to be illustrative and that other design intents not specifically discussed are also within the scope of the present invention.

The calculated design intents are represented by one or more of a vector, plane or poly-line depending upon the type of design intent. For example, extrusion directions, revolving centers and parting directions are represented by a vector, parting directions are represented by one or more vectors, extrusion profiles, revolving profiles sweeping path curves, center lines of curved pipes, fillet centers, virtual sharp edges, bead lines, silhouette curves and parting curves are represented by poly-lines, and orthogonal planes and mirroring planes are represented by planes. The design intent facility performs error minimization routines to determine vector, plane and poly-line orientations from the mesh. Vectors have the variables position X, Y, Z, and direction I, J, K. Planes have the variables position X, Y, Z, and normal direction I, J, K. Poly-lines are many segments of straight lines which are derived from polygon edges (i.e.: from a silhouette poly-line creation that gives a projection of the polygon edge to a plane).

The design intent facility 8 performs error minimization routines to determine design intents from the mesh. One example for a rectangular shape is listed below:

1) An extrusion is created using a base sketch. The shape is known to be rectangular. The dimensions of the rectangle may be called X & Y, and the extrusion distance Z. X, Y & Z are the width, depth and height of the rectangular box. These are the parameters of the model.
2) The constraint that the sketch lines are perpendicular to each other is inherently enforced, other constraints could be added.
3) The user may desire to minimize the error (minimize the deviation) over the whole mesh, or alternatively the user may want to minimize the error over selected mesh regions.
4) The parameters X, Y, Z are adjusted using a multivariable optimization process along with automatic outlier (noisy data) removal techniques to minimize the deviation.
5) A multivariable optimization may be used in many numerical settings. For example, to fit a straight line to data, the user starts with the line equation $y=m*x+b$, where b and m are variables, and y and x are the 2 data sets. The user selects a starting m & b. The error is the difference (or "squared" distance; sum of the distances squared) between the data sets' y and the calculated y using the starting m & b and x. m & b are then adjusted until the error is minimized. This is Least Squares Minimization of Error, or multivariable optimization.

Figure 3A:
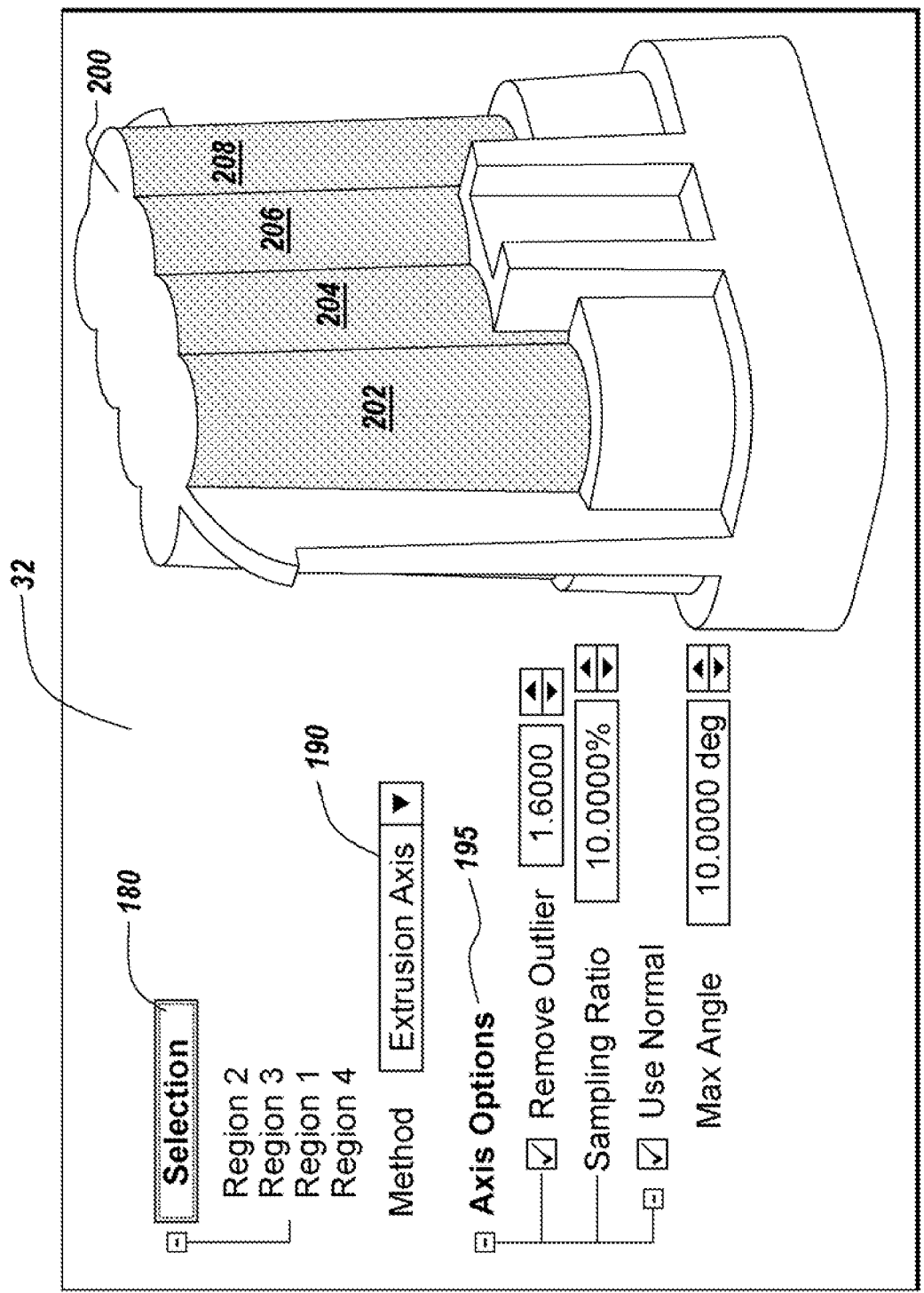
FIG. 3A depicts the selection of a mesh region in order to calculate an extrusion direction.
Figure 3B:
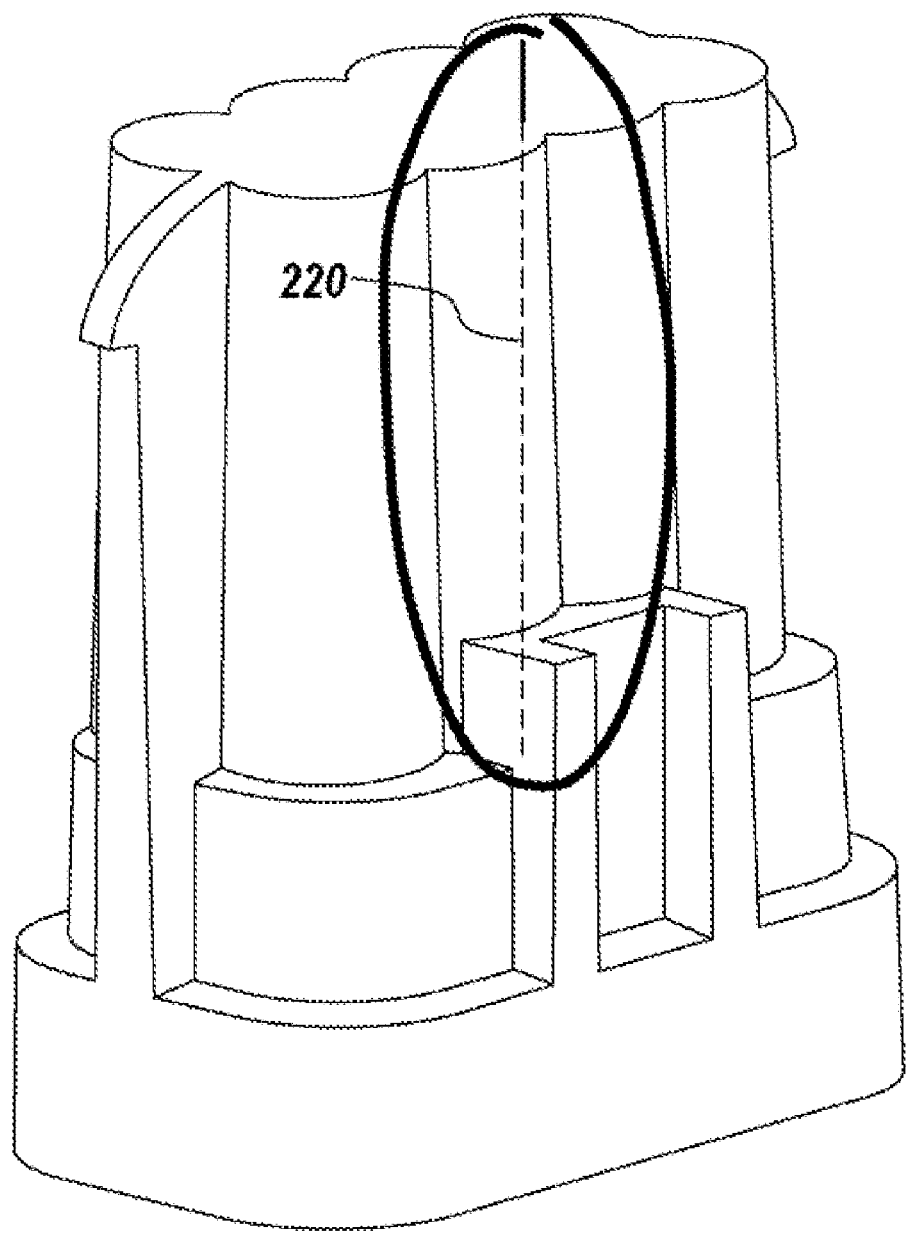
FIG. 3B depicts the calculated extrusion vector for the mesh region selected in FIG. 3A.

The design intent facility 8 may be used to determine an extrusion direction design intent. The user selects a mesh region or regions which may be side faces when extruding a planar profile. The design intent facility 8 then calculates a vector which can best express the extrusion direction. This process can be seen with reference to FIGS. 3A and 3B. In FIG. 3A, the user selects through a control 180 in the graphical user interface 32 the front four cylindrically shaped regions 202, 204, 206 and 208 in the mesh model 200. The user also selects through another control 190 the 'Extrusion Axis' method. Starting with an estimation for the extrusion axis (A) and determining the angle between it and all the normal vectors of all faces in the region (N) a value AN is obtained for all faces in the region (this is the angle between the polygon face normal and the current best estimate for the extrusion axis. A minimization procedure is performed to minimize the differences between the set of AN measurements. After the minimization procedure an average AN is produced. AN=90 degrees–drafting angle (Therefore if AN=90 degrees, then there is no draft in the extruded part). Additional options relating to the axis such as the removal of outliers, sampling ratios and the maximum angle for the extrusion vector may also be configured by the user through a third control 195. Following the selection of the four regions 202, 204, 206 and 208, the design intent facility 8 calculates a vector for the extrusion direction. The extrusion direction algorithm for mesh data is used which involves the solution of a matrix equation. The calculated extrusion direction vector 220 for the user selected mesh region is circled in FIG. 3B. The portion of the extrusion direction vector 220 inside the body of the mesh region is denoted by a broken line.

Figure 4A:
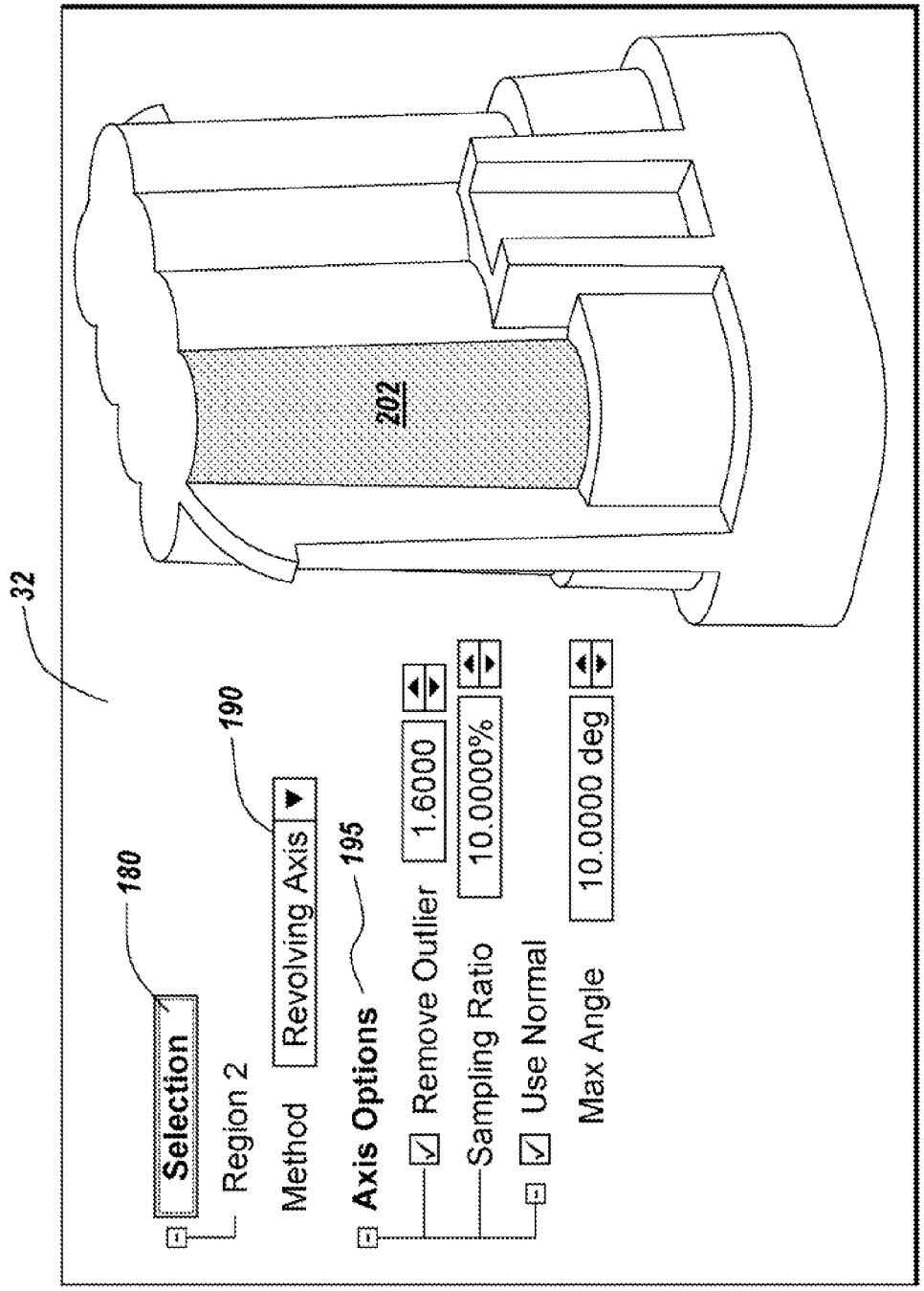
FIG. 4A depicts the selection of a mesh region in order to calculate a revolving center.
Figure 4B:
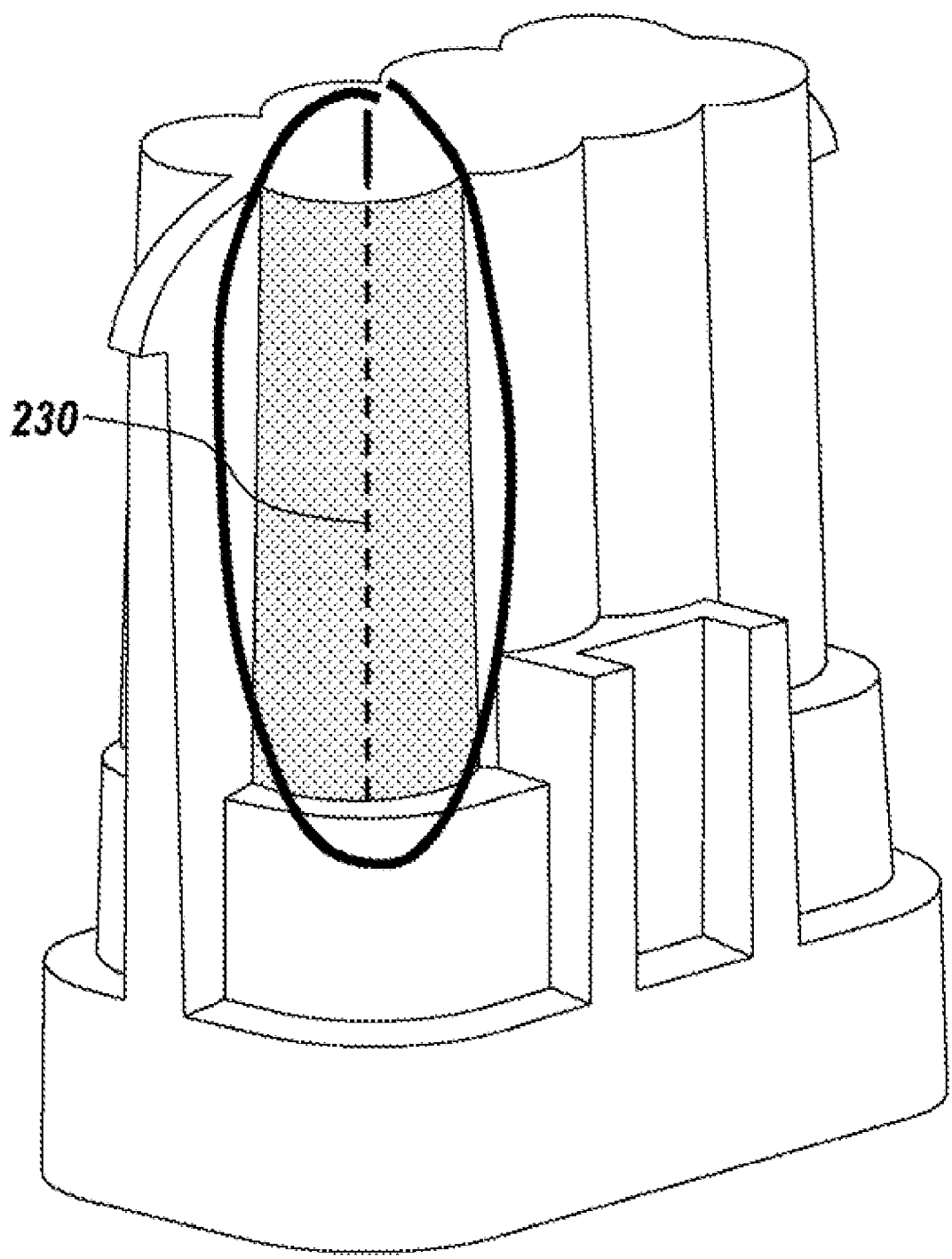
FIG. 4B depicts the calculated vector expressing the revolution center for the mesh region selected in FIG. 4A.
Figure 4C:
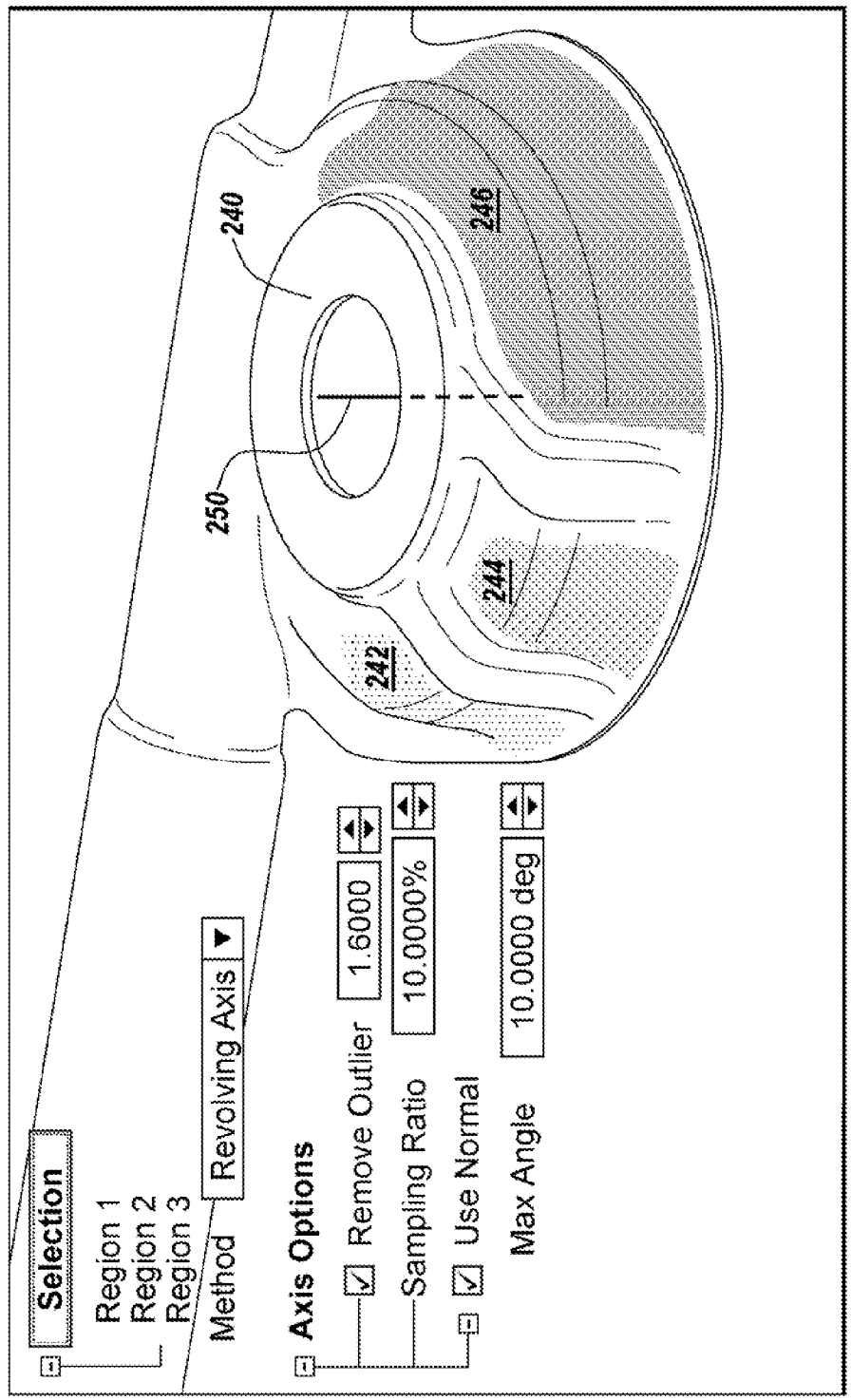
FIG. 4C depicts a calculated revolving center for multiple selected mesh regions.

The process of determining a revolving center design intent is similar. The user selects one or more mesh regions (which may be side faces when revolving a planar profile). The design intent facility 8 then calculates a vector which can best express the revolution center axis. This process can be seen with reference to FIGS. 4A, 4B and 4C. In FIG. 4A, the user selects the first drafted cylinder 202 (region 2) that is cone-shaped using the selection control 180. It would be desirable to estimate the revolving axis of this cylinder. The user uses the method control 190 in the graphical user interface 32 to select the 'Revolving Axis' method. The revolution vector algorithm is used which involves the solution of a matrix equation. For the region selected in FIG. 4A, the circled dashed line in FIG. 4B shows the calculated revolving center 230. The revolving center may also be detected for multiple regions. In FIG. 4C, the user selects region 1 (242), 2 (244) and 3 (246) in mesh model 240 with the selection control 180. The design intent facility 8 calculates the depicted revolving center 250 for the user-selected three regions 242, 244 and 246.

Figure 5A:
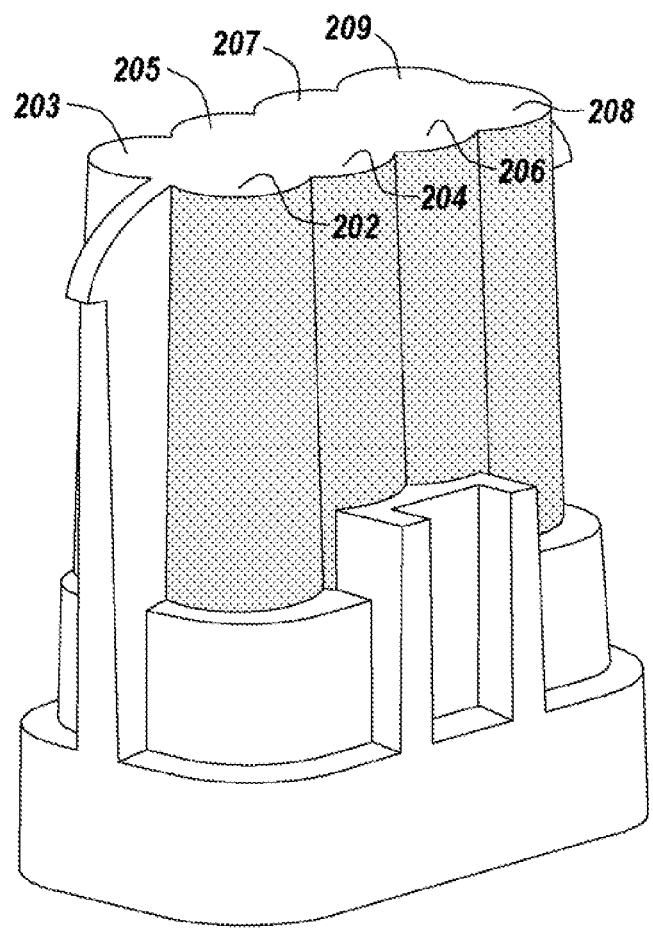
FIG. 5A depicts the selection of a mesh region in order to calculate an extrusion profile.
Figure 5B:
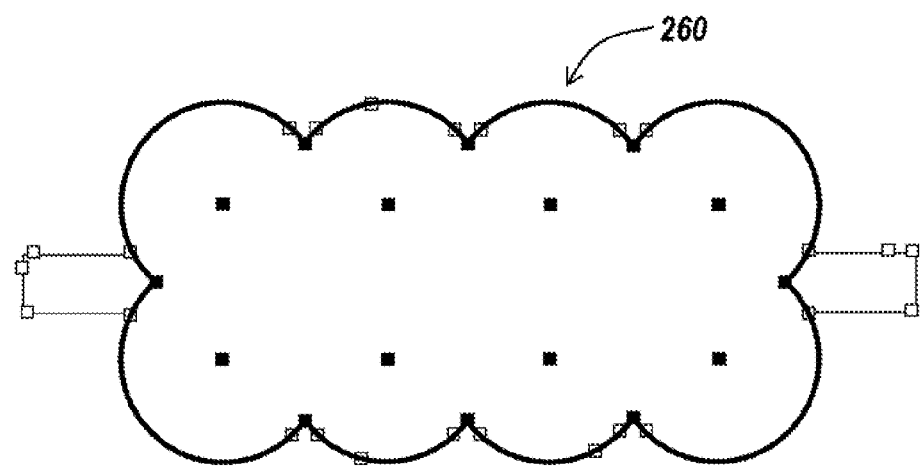
FIG. 5B depicts the calculated poly-line expressing the extrusion profile for the mesh region selected in FIG. 5A.

The design intent facility 8 may also be used to determine an extrusion profile design intent. The user selects a mesh region or regions (which may be side faces when extruding a planar profile) and a sketch plane on which the profile is generated. The design intent facility 8 creates a silhouette curve of the region data of an extruded solid and projects the silhouette curve onto the sketch plane (with the extrusion axis normal). A series of linear segments on the plane (the projection of the silhouette curve) are represented in a poly-line (the extrusion profile). This process can be seen with reference to FIGS. 5A and 5B. In FIG. 5A, if the user selects the front four 202, 204, 206 and 208 and the back four cylindrical regions 201, 203, 205 and 207, and chooses an 'Extrusion Profile' command, the calculated extrusion profile 260 design intent depicted in FIG. 5B is produced. The design intent facility 8 internally determines the extrusion direction using the extrusion direction command. Using all of the flattened (projected) data, the design intent facility 8 best fits a series of lines to this data to create the poly-line that is the extrusion profile. The result is a poly-line rather than exact circles.

Figure 6A:
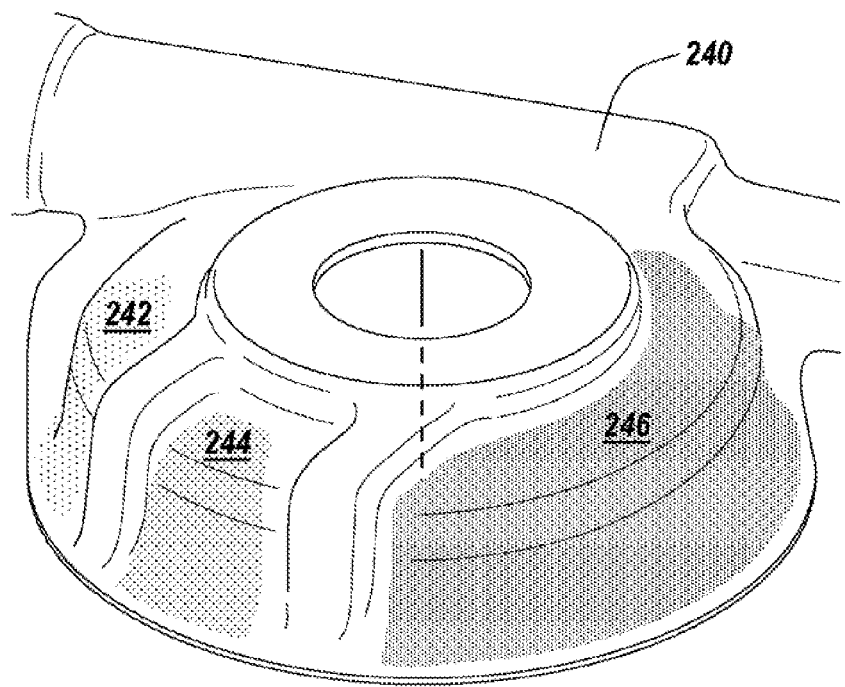
FIG. 6A depicts the selection of a mesh region in order to calculate a revolving profile.
Figure 6B:
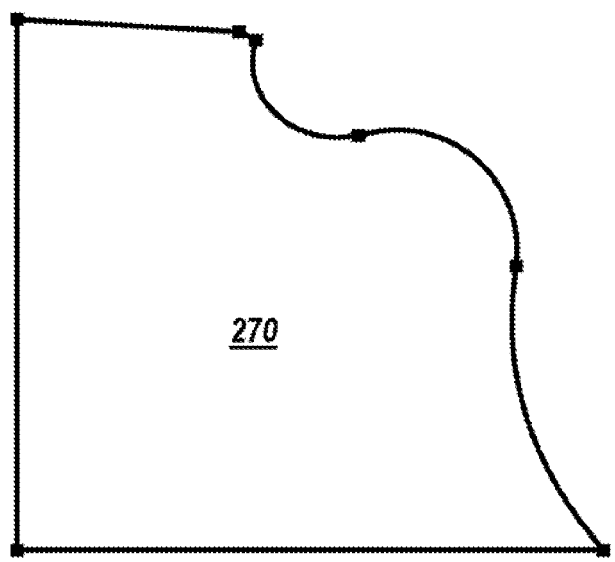
FIG. 6B depicts the calculated poly-line expressing the revolving profile for the mesh region selected in FIG. 6A.

In order to determine a revolving profile design intent, the user selects a mesh region or regions (which may be side faces when revolving a planar profile) and a revolving center axis. The design intent facility 8 creates a rotation image of the mesh region or regions selected and generates a cross sectional poly-line between the rotation image and a plane which passes the revolving axis. This process can be seen with reference to FIGS. 6A and 6B. In FIG. 6A, the user selects three regions 242, 244 and 246 from the model 240 and uses a 'revolving profile' command made available by the design intent facility 8 through the graphical user interface 32 to determine the revolving section or the "revolving profile". The revolving profile is an estimate of the 2D sketch which could be used to revolve around a revolving axis and create a solid. The revolving profile 270 that is calculated for the selected regions in the model 240 in FIG. 6A is seen in FIG. 6B. Revolving the pattern 270 of FIG. 6B around a central axis would best fit the selected regions 242, 244 and 246. In order to determine the revolving profile 270, the design intent facility performs in the same manner as for the extrusion profile discussed above except that a "revolving center" command is used and all of the region data corresponding to a revolved solid is rotationally projected about this center to a sketch plane with the revolving axis being coplanar (as opposed to using an "extrusion direction" function and projection of region data). The points are thinned and a minimal spanning tree approach is used to form a poly-line. An exemplary minimal spanning tree approach may be found in "Curve Reconstruction from Unorganized Points", In-Kwon Lee, POSTECH Information Research Laboratories.

The design intent facility 8 may also be used to determine a mirroring plane design intent when the given mesh regions are symmetric to a certain plane. To identify the mirroring plane, the user selects a mesh region(s) and specifies a plane as an initial approximation which is roughly close to the mirroring plane. The design intent facility 8 copies the given mesh region or regions and transforms it/them symmetrically to the given plane. The design intent facility 8 transforms the copied mesh region or regions to minimize the sum of the distances between points in overlapping portions by using an ICP (iterative closest points) algorithm and the resulting transformation matrix from the ICP algorithm is used to adjust the mirror plane. The design intent facility 8 stores the transformation matrix and applies it iteratively to the given plane until the algorithm converges and then outputs the result to the user 20.

Figure 7A:
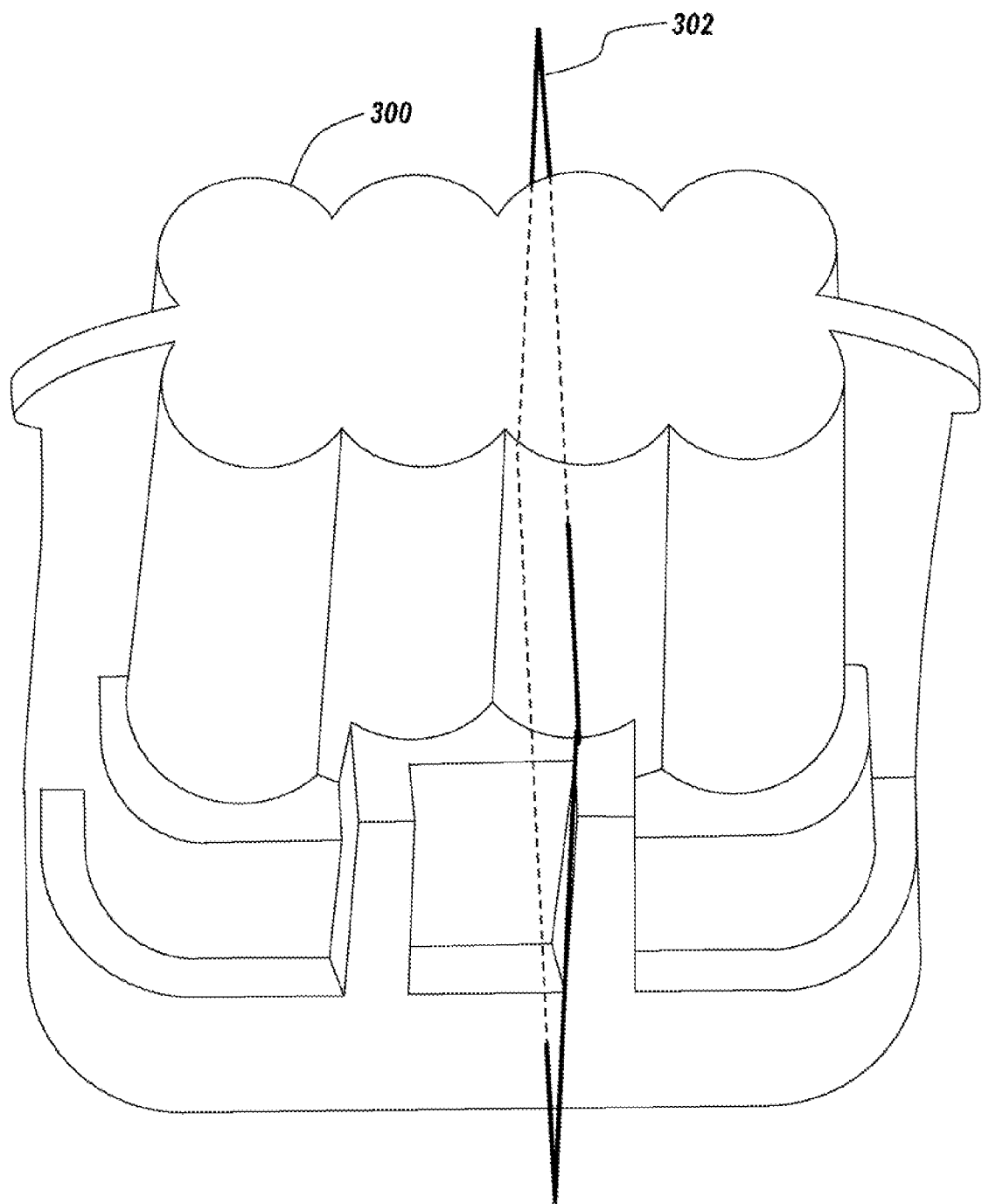
FIG. 7A depicts the selection of a mesh region in order to calculate a mirroring plane.
Figure 7B:
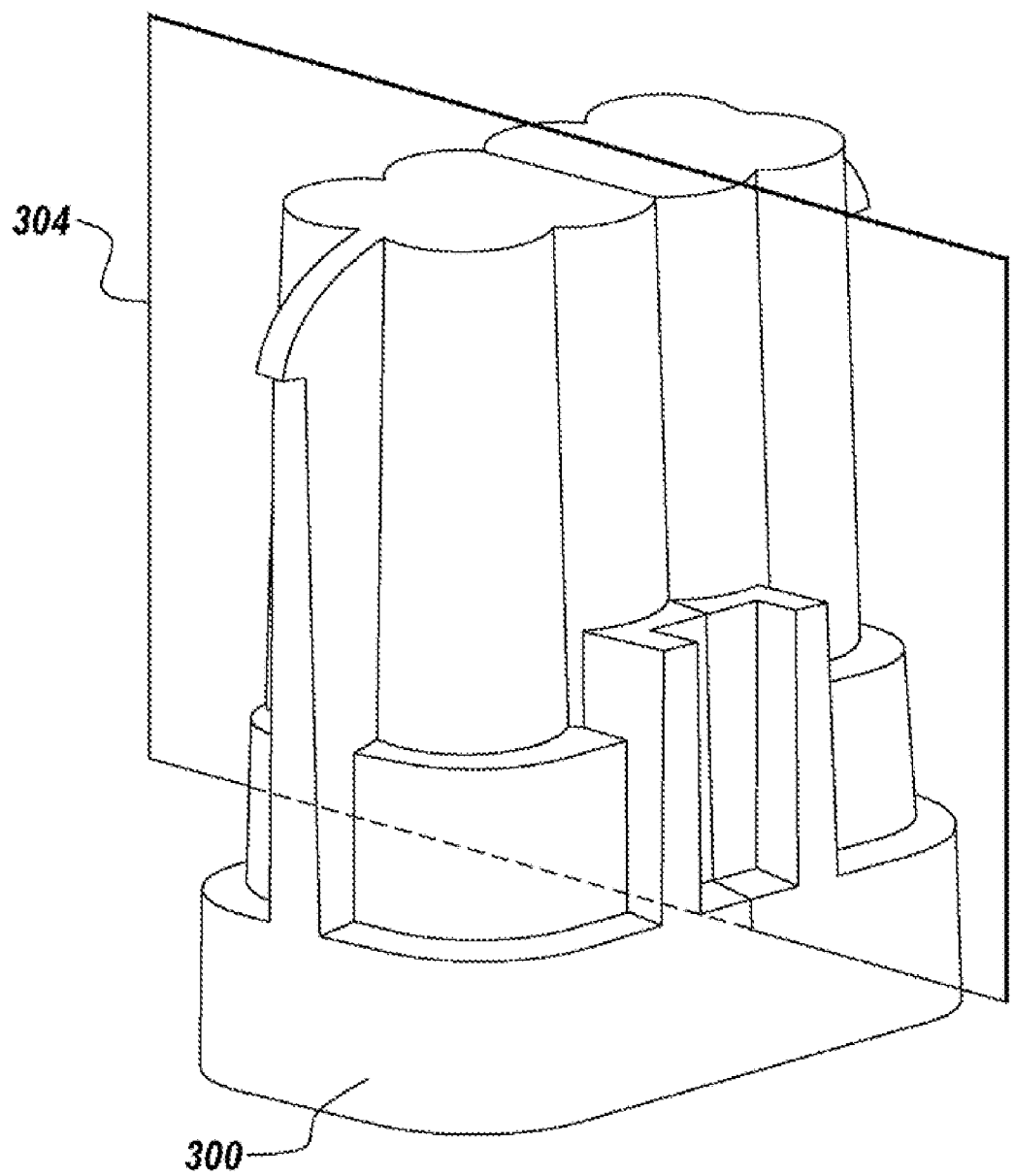
FIG. 7B depicts the calculated plane expressing the mirroring plane for the mesh region selected in FIG. 7A.

The process of determining a mirroring plane can be seen with reference to FIGS. 7A and 7B. In FIG. 7A a mirroring plane 302 for a model 300 is shown. The mirroring plane 302 represents the initial approximation given by the user. The execution of a 'Mirroring Plane' command using the design intent facility 8 of the present invention for all regions results in calculation of the mirror plane 304 for the model 300 that is shown in FIG. 7B. The mirror plane 304 is calculated by applying the transformation matrix to the approximated plane 302 provided by the user.

Figure 8A:
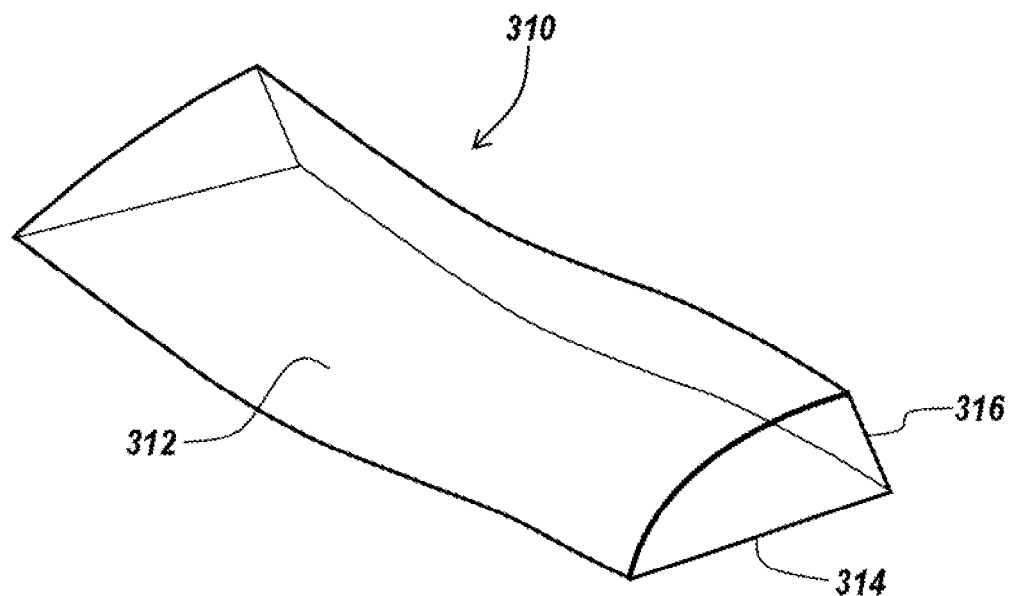
FIG. 8A depicts the selection of three mesh regions in order to calculate a sweeping path curve.
Figure 8B:
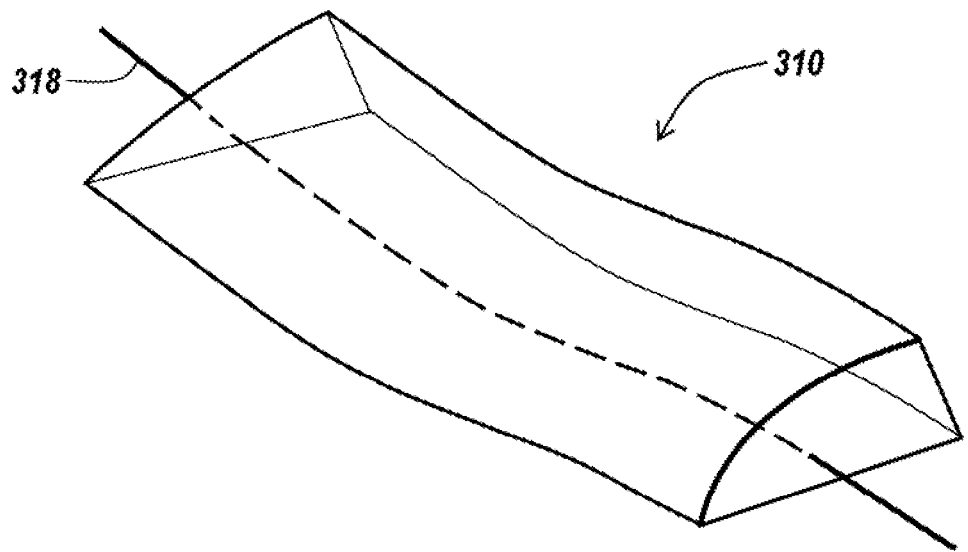
FIG. 8B depicts the calculated poly-line expressing the sweeping path curve for the mesh region selected in FIG. 8A.

In order to determine a sweeping path curves design intent, the user selects a mesh region or regions (which may be side faces) when sweeping a profile curve. This process can be seen with reference to FIGS. 8A and 8B. In FIG. 8A the three regions 312, 314 and 316 for the model 310 (only the top region/face 312 is directly visible in FIG. 8A) comprising the swept surface are selected by the user. The design intent facility then estimates a curve for sweeping 318 for the model 300 as shown in FIG. 8B. The surface may then be created by sweeping the three sided profile along the poly-line 318 shown. The algorithm is given a starting point on the sweep profile. (The guide curve is what the user wants to determine in the end). Sectional curvature (the curvature is dependent on the section direction and is a discreet calculation) is locally determined (at discreet points) on the mesh surface. The section directions which result in the local minimum and maximum curvature are calculated and are the principal curvature directions. The section directions are orthogonal to each other at each given point. The software tracks the curvature flow based on the principal curvature directions (based on the discrete sectional curvature evaluations). One guide curve will be calculated based on the initial search location (as there are an infinite number of guide curves for a given surface).

Figure 9A:
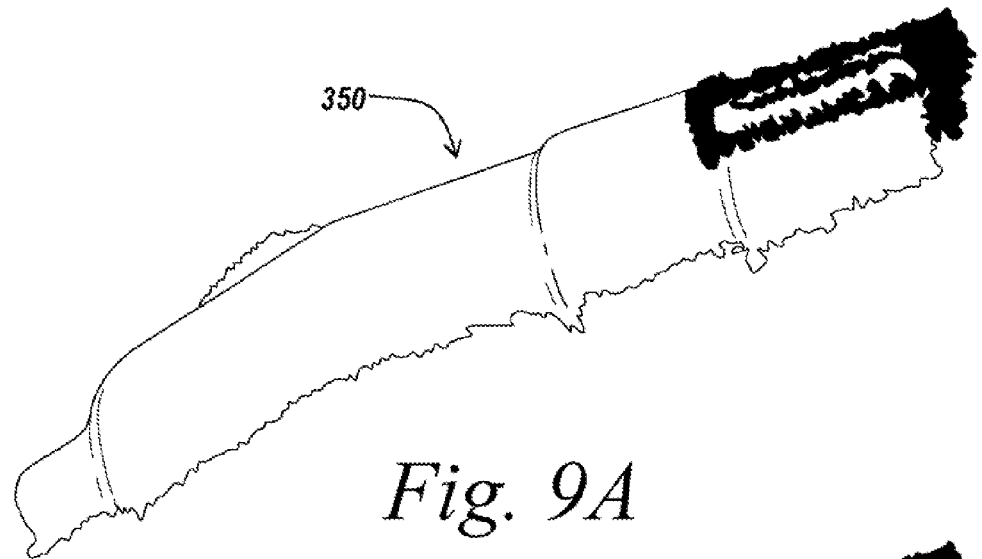
FIG. 9A depicts the selection of a mesh region in order to calculate a center line of a curved pipe.
Figure 9B:
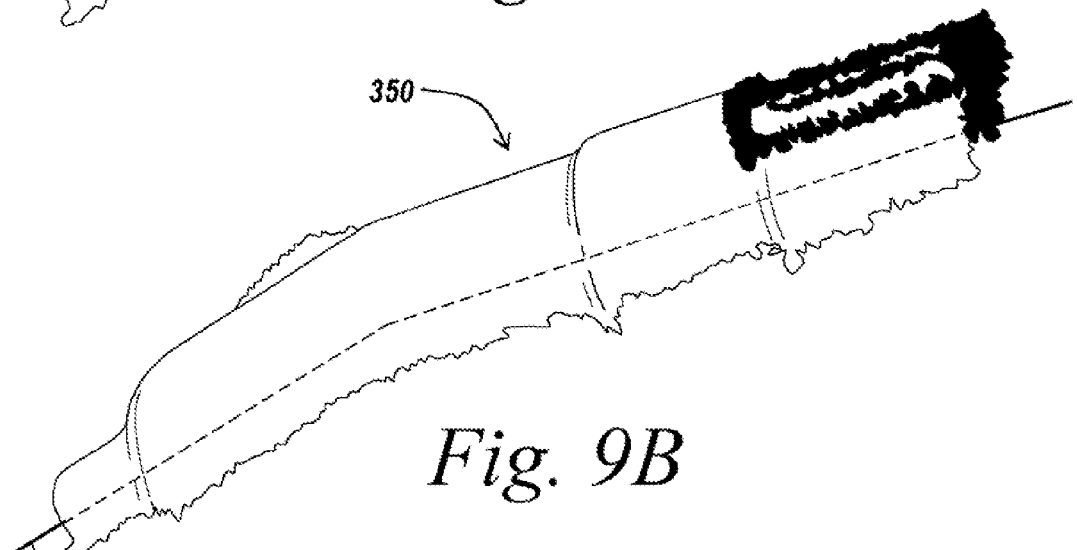
FIG. 9B depicts the calculated poly-line expressing the center line of a curved pipe for the mesh region selected in FIG. 9A.
Figure 9C:
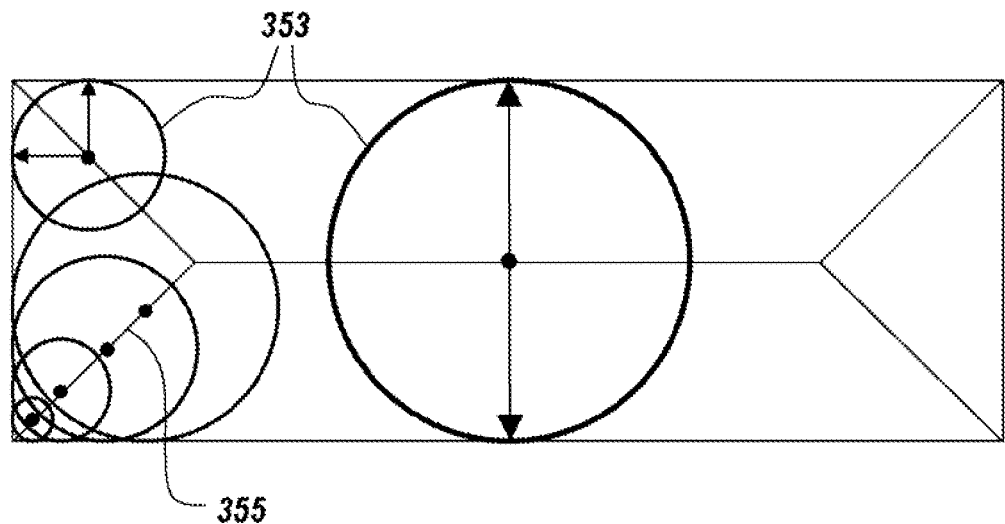
FIG. 9C depicts the maximal fitting spheres and medial axis used to determine the centerline for the curved pipe.
Figure 9D:
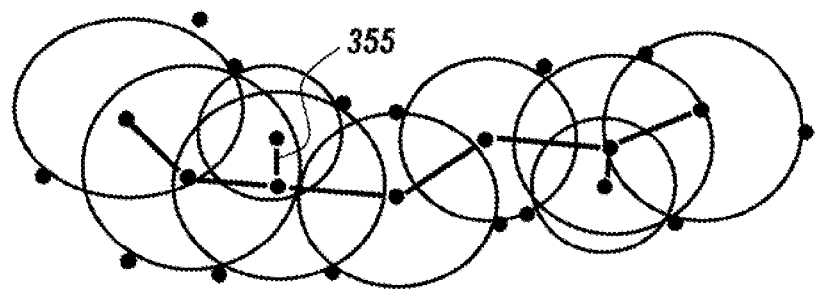
FIG. 9D depicts a minimum spanning tree (MST) and poly-line connecting the consecutive MST points.
Figure 9D:
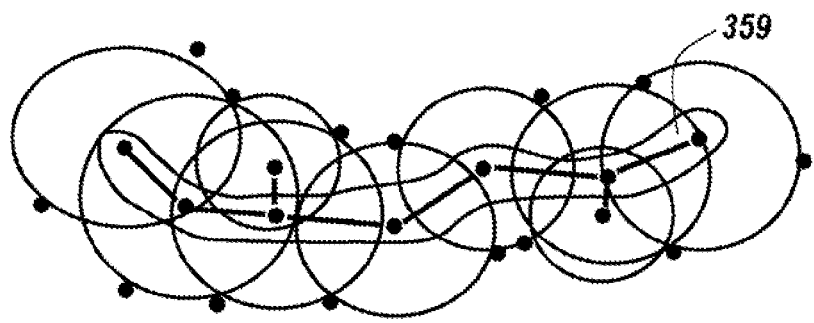

The design intent facility 8 may also be used to determine a center line of a curved pipe design intent. This facility uses similar workflow to the sweeping guide curve design intent. The user 20 selects a mesh region or regions (which may be side faces) when sweeping a circular profile. The process works similarly to the sweeping guide curve discussed above. This process can be seen with reference to FIGS. 9A and 9B. In FIG. 9A data from an incomplete scan of a pipe with a curve in the center 350 is shown. The design intent facility can calculate the original design intent by determining the centerline of the pipe 350 and creates a best fit curve 352 passing through the centerline as shown in FIG. 9B. The process of determining the centerline is further explained in FIGS. 9C and 9D and begins with the determination of a 'medial axis' for the selected region as shown in FIG. 9C. A medial axis is a set of points (locus) where the point 355 is a center point of a sphere inscribed in the region (maximal sphere) 353. The medial axis points are thinned and a Minimal Spanning Tree (MST) is calculated 357 as shown in FIG. 9D. A poly-line is created which is a set of fine segments linking MST points consecutively. The original point cloud is thinned using a medial axis approach using maximal spheres and a minimal spanning tree is generated from the medial axis points. The consecutive segment is circled in the lower figure and is the poly-line 359 representing the curved pipe center.

Figure 10:
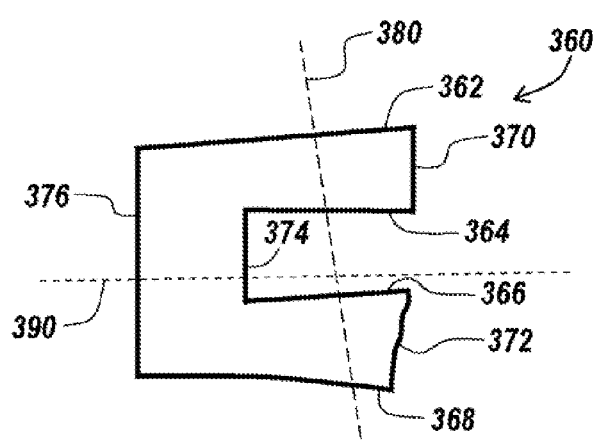
FIG. 10 depicts the minimization of undercutting while finding a parting direction intent.

The design intent facility may also calculate a parting direction intent. When creating a molded pan with two molds, one for the top and one for the bottom, the molds must be able to slide out and not be impinged by the molded part. For example, one can only mold (the outer surface of) an hourglass using by placing two molds on the sides. If there were molds of the top and bottom it would not be possible to remove them. The software calculates one or many possible directions for parting (parting directions). These can be visualized as one or many vectors or a cone, all which signify feasible directions for parting. The parting direction will attempt to minimize undercutting of the part. Tolerance parameters regarding the amount of undercutting allowed are applicable to this facility. The minimization of undercutting can be seen with reference to FIG. 10. A molded part 360 includes surfaces 362, 364 366, 368, 370, 372, 374 and 376. The design intent facility 8 attempts to find a parting direction intersecting with the fewest number of surfaces. The direction 380 of the vertical line will cause a large amount of undercutting if used as the parting direction because vectors in this direction will intersects with more than 2 surfaces (it will intersect with surfaces 362, 364, 366 and 368). In contrast, the direction 390 of the horizontal line will cause less undercutting and would be a more likely candidate for parting direction (as it intersects only with surfaces 374 and 376). The calculation of normal angles on the mesh in reference to a putative parting direction is used to determine the one (and later the many) possible directions for the parting direction. The present invention will also create parting curves which are curves to split a model into two undercut-free models when moving the model along given the parting direction and draft angle.

Additionally, the design intent facility 8 may also be used to determine a circular pattern axis design intent. In order to determine a circular pattern axis design intent, the user selects a mesh region or regions which may be created by the circular pattern. The design intent facility then calculates transform matrices by registration between regions. The registration between regions geometrically aligns a three-dimensional model. The registration process utilizes a PAT (principal axis transform) and ICP (Iterative Closest Points) algorithm. The PAT algorithm aligns the gravity center and principal axis of a model. The ICP algorithm iteratively minimizes the sum of distances between matched points within criteria of transformed models. The PAT is used as initial coarse alignment, and ICP is used as fine alignment. The result of the registration process is expressed by a transform matrix (rotation, translation). The design intent facility 8 chooses one reference region from input n-regions. And n−1 transform matrices are calculated by n−1 registrations from each n−1 region to reference region. The application then extracts a revolution center axis from the calculated transform matrices.

Similarly, the design intent facility 8 may also be used to determine a linear pattern axis design intent. In order to determine a linear pattern axis design intent, the user selects a mesh region or regions which may be created by the linear pattern. The design intent facility then calculates transform matrices by rotation locked constrained registration between regions. The rotation locked constrained registration process operates in the same manner as the registration process described above except that it ignores the rotation term of the transform (i.e. only translational transform) on registration. The application then extracts a translational pattern axis from the calculated transform matrices.

Additionally, the design intent facility 8 may also be used to determine a fillet center, virtual sharp edge, bead line and silhouette curve represented as poly-lines. For a fillet center, the user selects a mesh region or regions which may be created by fillet. The design intent facility 8 calculates poly-lines using centers extracted from fillet regions. For virtual sharp edges, the user selects a mesh region or regions and the design intent facility calculates an expanded fitted surface or meshes. The design intent facility then calculates intersection poly-lines between expanded entities. For a bead line, the user selects a mesh region or regions which include a bead-line region. The design intent facility 8 then extracts groove regions from the mesh regions and calculates poly-lines which pass through the centerline of the groove. For a silhouette curve, the user selects a mesh region or regions and a direction vector (or plane). If a plane is selected the design intent facility projects mesh region(s) to the selected plane. The design intent facility then creates poly-lines from boundary loops of the projected mesh region or regions. If a vector is selected the design intent facility calculates poly-lines as parting lines.

Once the illustrative embodiment of the present invention has calculated a requested matched design intent, the user may modify the mesh region by including more meshes in it, excluding meshes from it, smoothing the geometry, or using other mesh editing tools. When adding a mesh, the present invention allows a user to choose the file of the mesh and import it into the program. Regions may be created out of this newly imported mesh and the user may then use a "Merge Region" command to add it to a region. The user is also able to perform elementary mesh operations such as 'mesh merge' and 'mesh combine'. The 'mesh merge' operation merges the meshes into one mesh by performing averaging operations to overlapping regions. In the example below, where there are holes in the starting mesh, if the user mesh performs a merge operation using an imported mesh which has no holes, then the "merged mesh" is an average of the starting mesh which has holes and the imported mesh which does not have holes. The data from the imported mesh is used to fill in the holes in the starting mesh. The 'mesh combine' function works similarly but without averaging.

Following the mesh editing steps, the design intent facility 8 automatically recalculates design intents. The design intent determination process discussed above is then executed for the new data. The design intent facility 8 propagates the changes by tracing associations with all other entities such as 3D body modeling features, alignments, and 2D sketch profiles.

Figure 11A:
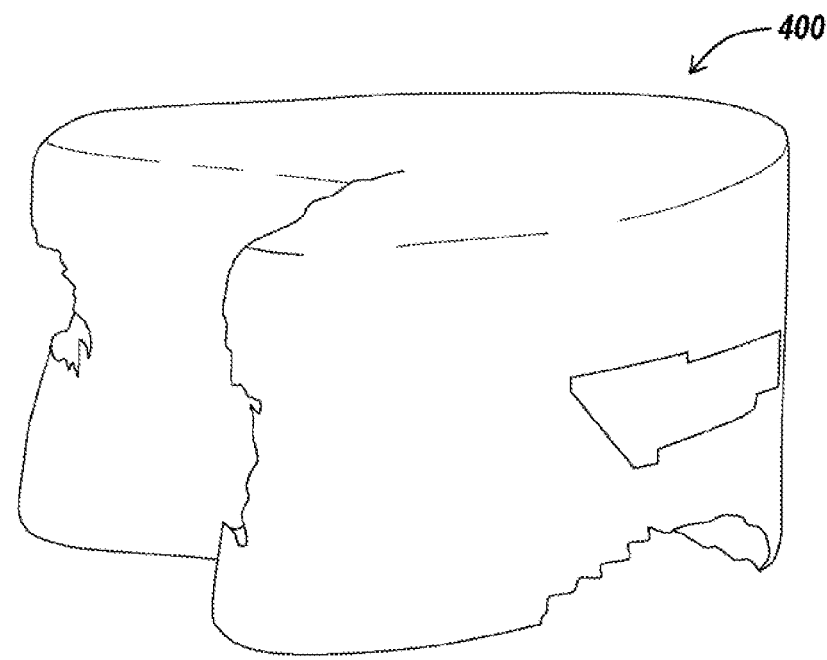
FIG. 11A depicts a poor mesh from which an incorrect CAD solid would be generated.
Figure 11B:
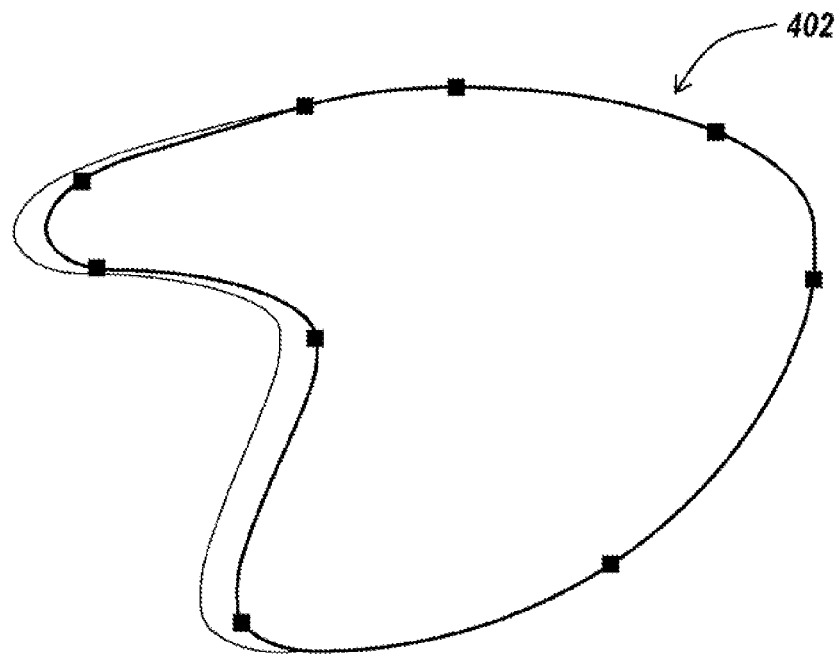
FIG. 11B depicts the poor data used for the poor mesh of FIG. 11A.
Figure 11C:
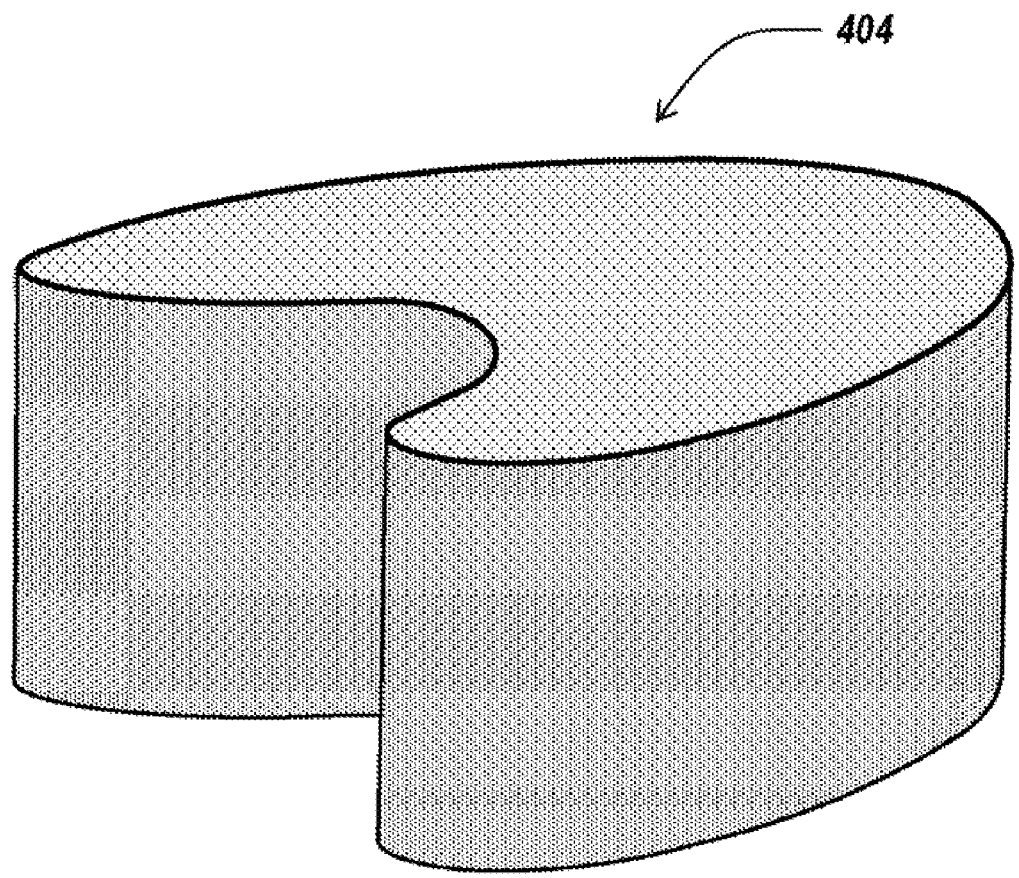
FIG. 11C depicts the mesh after mesh editing.
Figure 11D:
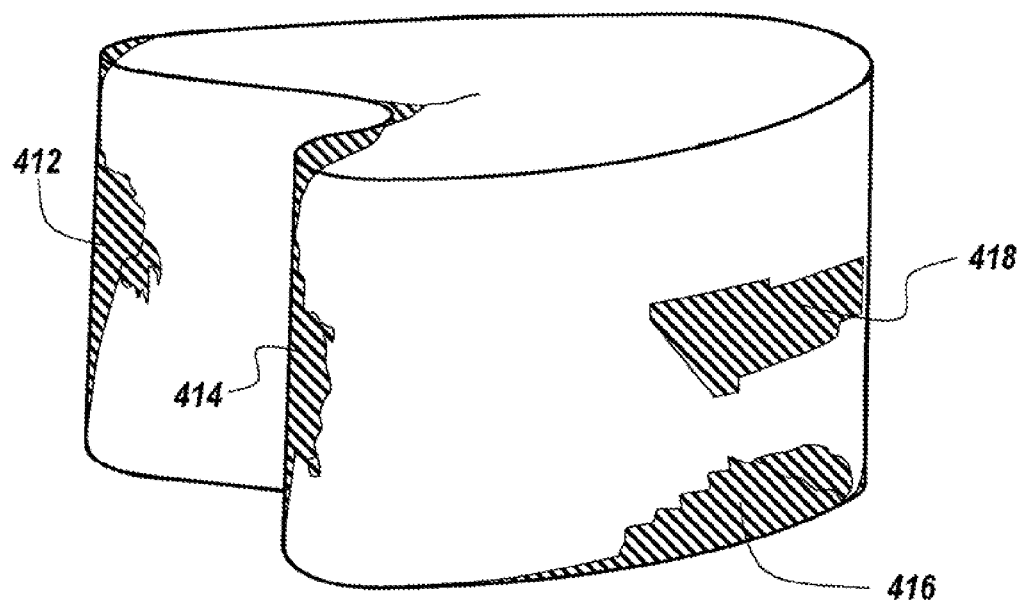
FIG. 11D depicts the mesh after combining sets of data.
Figure 11E:
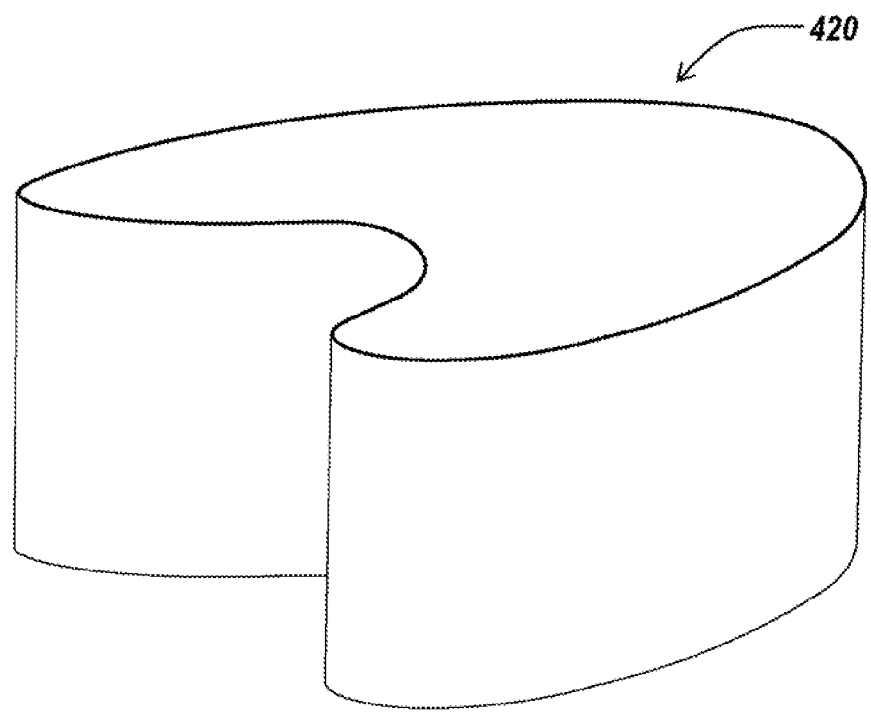
FIG. 11E depicts a regenerated CAD solid.

The benefit of the above-noted features may be seen with reference to FIGS. 11A-11E. Starting with poor quality scan data and performing no modifications results in a CAD solid which is not correct. FIG. 11A depicts a poor mesh 400 from which an incorrect CAD solid would be generated. FIG. 11B depicts the poor data 402 used to generate the incorrect CAD solid. The present invention however allows the user to fix the scan data by performing mesh operations such as 'smooth' and 'hole fill', or adding or removing meshes in order to generate a better mesh. An improved mesh after mesh editing operations have been performed on the poor scan data 402 is shown in the model 404 depicted in FIG. 11C. As discussed above, the illustrative embodiment of the present invention allows sets of scan data to be combined as shown in the model 410 depicted in FIG. 11D. The combined sets of data are used to fill in the voids 412, 414, 416 and 418 in the mesh, average out the noise, or remove the bad data. Mesh operations, including adding or removing data of the mesh, are automatically tracked by the design intent facility which recalculates the design intent. These changes impact the calculation of vectors, planes and poly-lines. The recalculation impacts other entities such as 3D body modeling features, alignments, 2D sketch profiles and other entities, as reflected in the automatic regeneration of an updated CAD solid 420 shown in FIG. 11E.

Figure 12A:
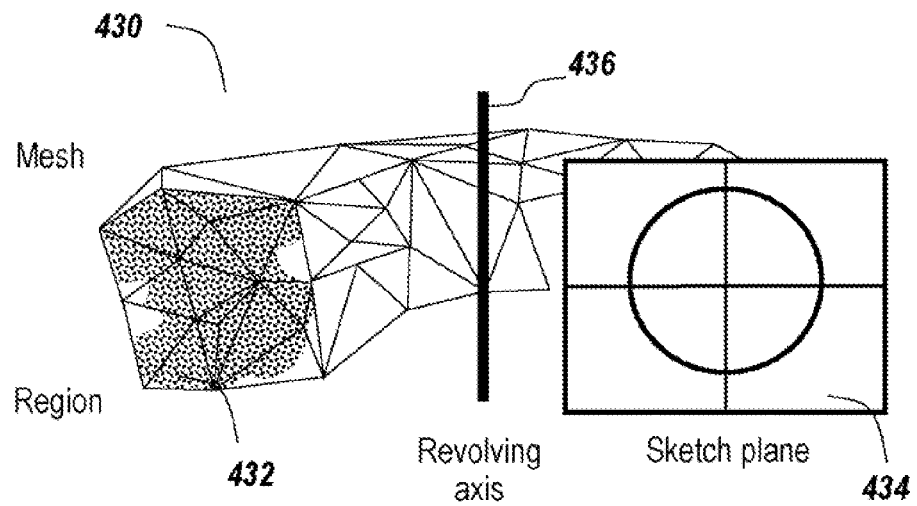
FIG. 12A and FIG. 12B depict the calculation of revolving angles.
Figure 12B:
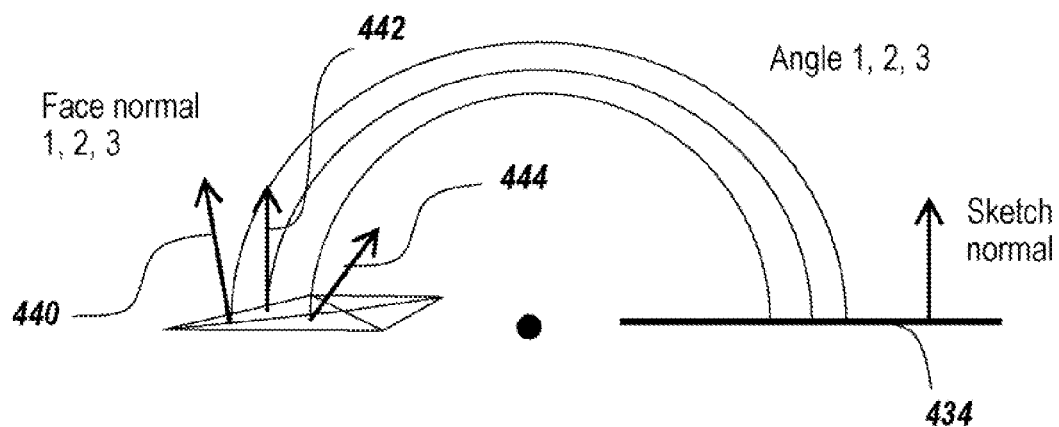

For 'Revolving Angle' and 'Extrusion Distance' features, a set of measurements of individual polygons is generated in the circular direction of revolution or the linear direction of extrusion in order to determine these measures (angle or distance). Both of these measures require an initial sketch plane (and the revolving angle additionally requires a revolving center-line). The determination of the revolving angle feature may be seen with reference to FIGS. 12A and 12B. The angle between the sketch plane 434 and the center of each face in a region 432 in a model 430 is measured (angle 1 (440), angle 2 (442), and angle 3 (444). Outliers are filtered based on the normal of each polygon face and the sketch normal and the revolving axis 436. A revolving axis is defined by a line which intersects with all position normal vectors at data points (all points in the selected region). "A position normal vector at data point" is a directional vector starting from a scan data point toward the normal direction. Viable angle measurements of the faces in the region (those not removed by the outlier filtering process) are averaged together (the max and min angle of the viable faces is also stored). The average value (average angle of viable faces) is suggested to the user 20 as is the max/min angle to use as the revolving angle for the sketch.

Figure 13:
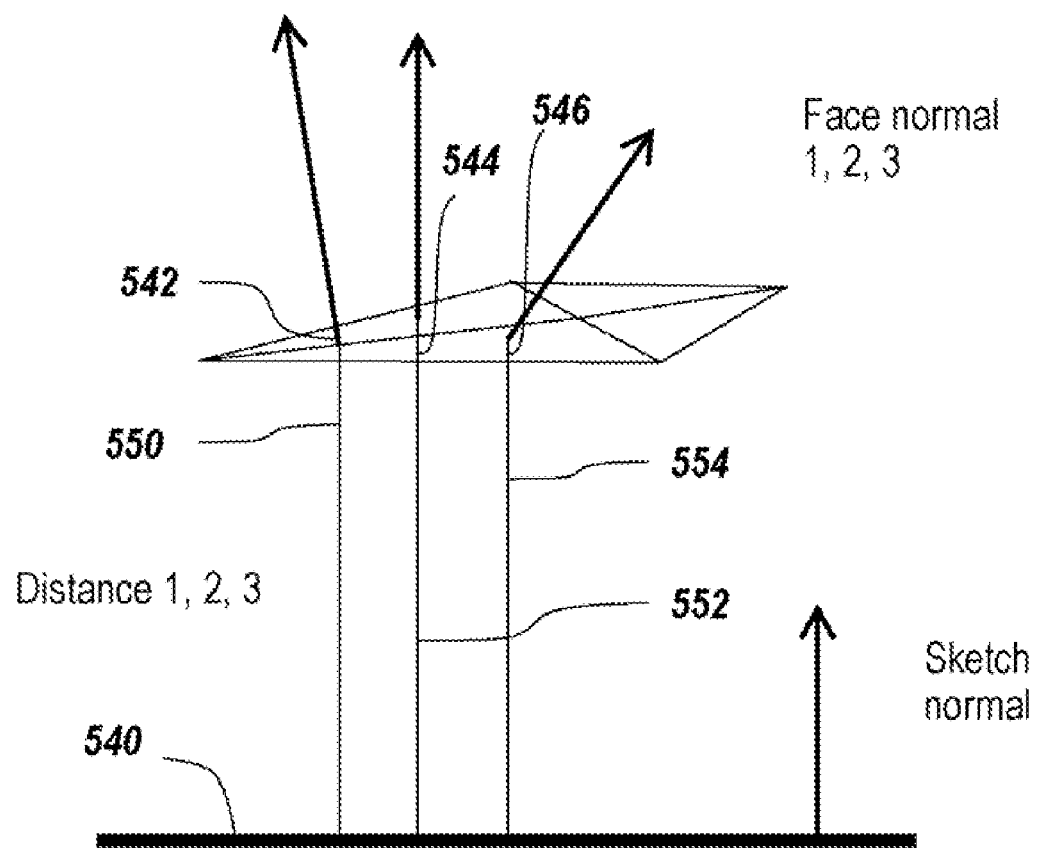
FIG. 13 depicts the calculation of an extrusion distance by the present invention.

The calculation of the extrusion distance feature is discussed with reference to FIG. 13. Similarly to the calculation of the revolving angle discussed above, the extrusion distance 550, 552 and 554 is measured from each face center 542, 544 and 546 to the sketch plane 540. Outliers are filtered based on the normal of each polygon face and the sketch normal 540 (they must be parallel within allowable angle tolerance). Viable distance measurements of the faces in the region (those not removed by the outlier filtering process) are averaged together (the max and min distance of the viable faces is also stored). The average value (average distance of viable faces) is suggested to the user 20 as is the max/min distance to use as the extrusion distance for the sketch.

The illustrative embodiment of the present invention also calculates for the user a best estimation when setting dimensions required for drafting, hollowing and filleting features.

When a user adds a drafting feature, a drafting dialog window is popped up. In the dialog window, the user can click a graphical button to calculate the drafting angle which is the most appropriate angle for the raw 3D scan data geometry. The present invention calculates the intersection curve between the raw 3D scan data and a plane which is slightly moved upward from the neutral plane from which the drafting angle is measured. At sampled points on the intersection curve, planes are produced whose normal vectors are tangent to the intersection curve. The intersection lines between those planes and the raw 3D scan data are then calculated. Angles are averaged between the normal vectors of the neutral plane and planes defined (the planes whose draft angle is in question). The present invention suggests 3 angle values to the user: the minimum, the maximum and average angles.

Figure 14:
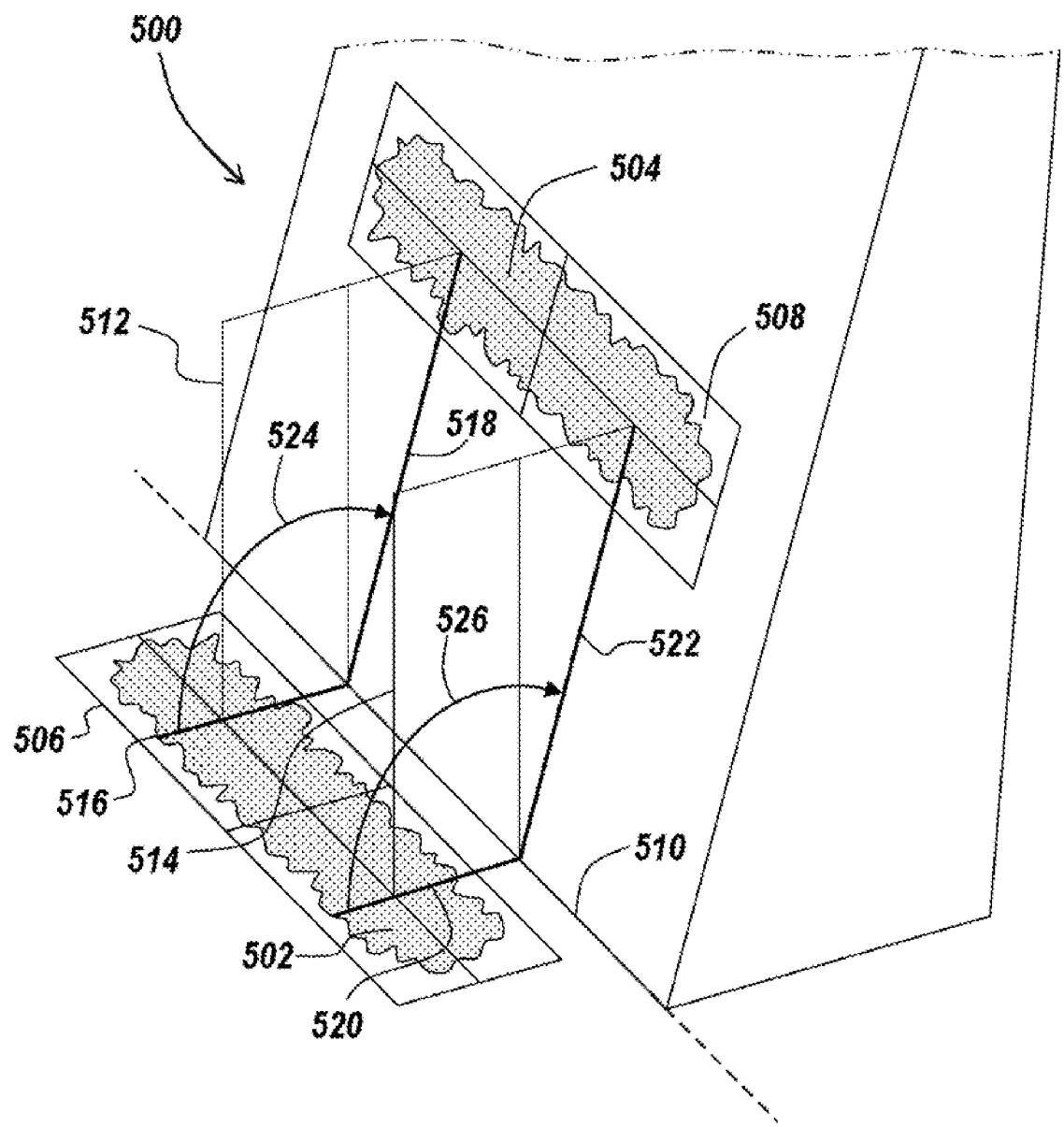
FIG. 14 depicts the calculation of drafting angles by the present invention.

The process of calculating drafting angles is depicted in FIG. 14. By choosing two regions 502 and 504 in the model 500 (the normal region—flat, base region 502 in FIG. 14; and the drafted region—angled, the inclined region 504 in FIG. 14), the two regions can be fitted to planar surfaces 506 and 508. It will be appreciated that the operation is not restricted to planar fit surfaces as the fit surfaces could be curved surfaces. Using the intersection of the extension of these surfaces, an intersection line 510 is determined (for non-planar surfaces a curve would be determined). The draft angle is sampled twice by creating two planes 512 and 514 perpendicular to the intersection curve and on each plane fitting two lines 516 and 518 and 520 and 522 respectively, and determining the angle of intersection of these lines (or the draft angle) 524 and 526. The user can use the average, max or min intersection (draft) angle to choose a drafting angle in the reverse design process. Section data is generated using the planes to orient data gathering (there are two planes where the angles are calculated in FIG. 14). Vectors (lines) are fitted to this section data using an error minimization technique. The angles are calculated based on these vectors. The fitting of planes follow error minimization techniques. It should be noted that two, non-parallel lines will intersect on a straight line or vector.

Figure 15A:
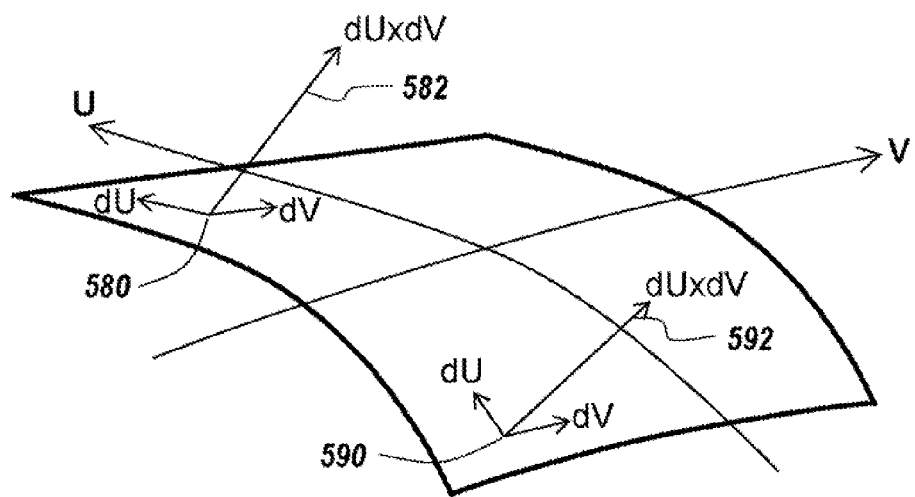
FIG. 15A depicts the calculation of a local surface normal.
Figure 15B:
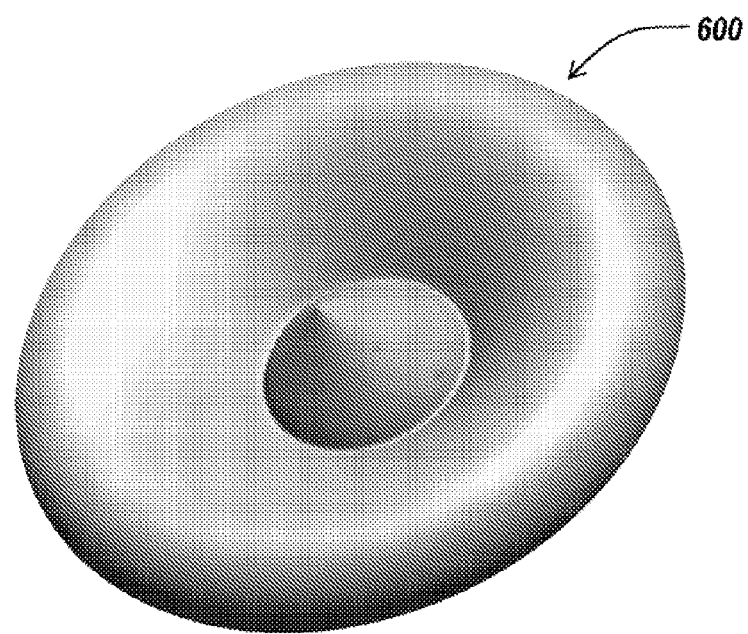
FIG. 15B depicts a solid created from the outside of a mesh.
Figure 15C:
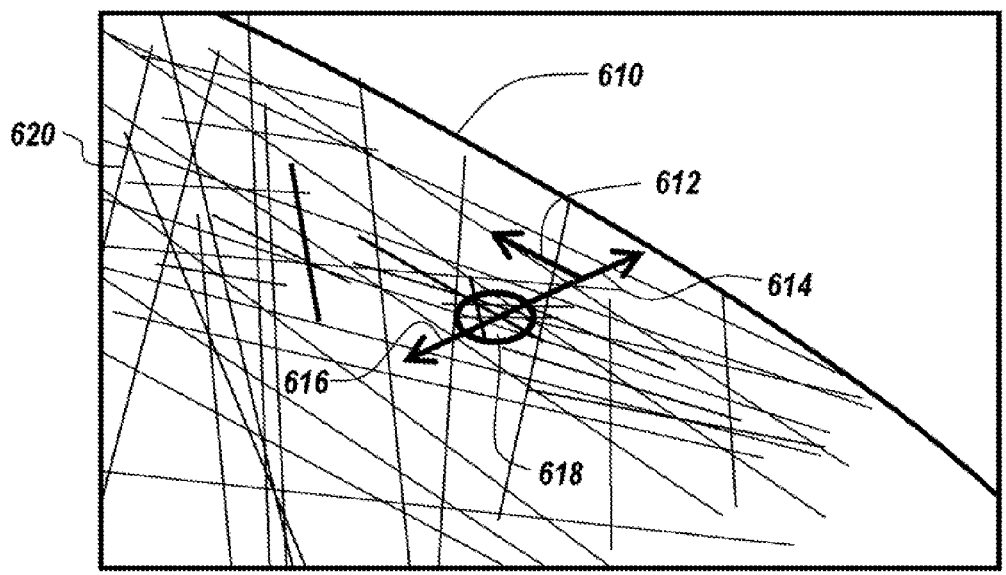
FIG. 15C depicts a cross section of the solid of FIG. 15B.

As noted above, the illustrative embodiment of the present invention may be used to determine hollowing (or shelling) thicknesses as illustrated in FIGS. 15A-15C. When a user adds a hollowing feature, a hollowing dialog window is popped up. In the dialog window, the user can click a graphical button to calculate the wall thickness which is the most appropriate to follow the raw 3D scan data geometry. The design intent facility 8 samples points on the body from which the hollowing feature should be added, and then generates rays along the normal direction which can be estimated by getting cross vector products of local surface U & V directions (dU×dV). This process is depicted in FIG. 15A. The distance between sampled points 580 and 590 is averaged and the intersection points between rays 582 and 592 and the raw 3D scan data is determined. It should be noted that error minimization could be used instead of distance averaging with the error minimization being based on the deviation between the hollowed shell and adjusting the hollow distance until the deviation is minimized. Three thickness values are suggested to the user: the minimum, the maximum and average thicknesses. Outliers may be removed based upon the angle difference between the ray and the normal vector of the intersection point. If the angle is bigger than a designated allowable tolerance, it is not considered in the hollowing thickness calculation.

Figure 15D:
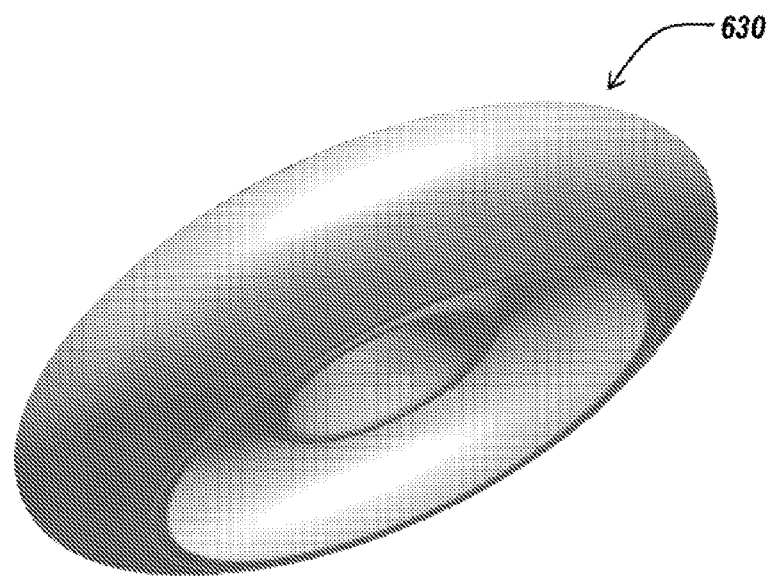
FIG. 15D depicts the solid of FIG. 15B after a hollowing operation performed by the present invention.

The hollowing technique first uses the outer surface of the mesh to create a solid which is not hollow. There are inner parts of the mesh which are not used for the outer surface. The inner parts of the mesh are used to determine the hollowing thickness. Calculation of thickness is first determined by calculating the local normal vector about the surface (perpendicular to local UV axes directions on the local created surface/solid). The distance between surface and raw mesh (raw 3d scan data) in this normal direction is the local hollowing distance. The complete hollowing field (all the distance measurements) is generated from these local hollowing distances (thickness). The user can choose to have a uniform hollowing thickness of the average, maximum, or minimum thickness of the hollowing field. A new surface is created on the inside of the existing solid/surface to create a new solid comprising of the original solid/surfaces and the newly created hollowed surfaces. FIG. 15B depicts a solid 600 created from the outside of a mesh. FIG. 15C depicts a cross section 610 of the solid 600 of FIG. 15B. The cross section 610 indicates local UV axes 612 and 614, normal direction 616 and the local intersection 618 between the normal direction 616 and the mesh 620. FIG. 15D depicts the solid 630 of FIG. 15B after a hollowing operation performed by the present invention.

A fillet is a concave or convex smoothing of an edge. The present invention may also be used to calculate fillet radii. The fillet radii may be constant or varying. When a user adds a fillet feature, a fillet dialog window is popped up. In the dialog window, the user can click a graphical button to calculate the filleting radius which is the most appropriate to follow the raw 3D scan data geometry. The present invention samples points from the edges which are specified by the user for the filleting. Then it defines planes for winch the normal vector is tangent to the edges at the points. The design intent facility 8 calculates intersection curves between the raw 3D scan data and the planes which have the normal vector tangent to edges at the points. Each intersection curve is decomposed into circular arcs and lines automatically. The application averages radii of the center are from the decomposed intersection curves for all the intersection curves calculated between the raw 3D scan data and the defined planes discussed above. If the filleting option is a constant value, three radius values are suggested to the user: the minimum, the maximum and average radius. If the filleting option has varying radii, radii are plotted in a new 2D graph window which allows the user to be informed of the tendency of radius change. The user can also pick multiple radii interactively in the 2D graph. The design intent facility 8 may also fit the best approximating curve from the 2D graph automatically.

Figure 16:
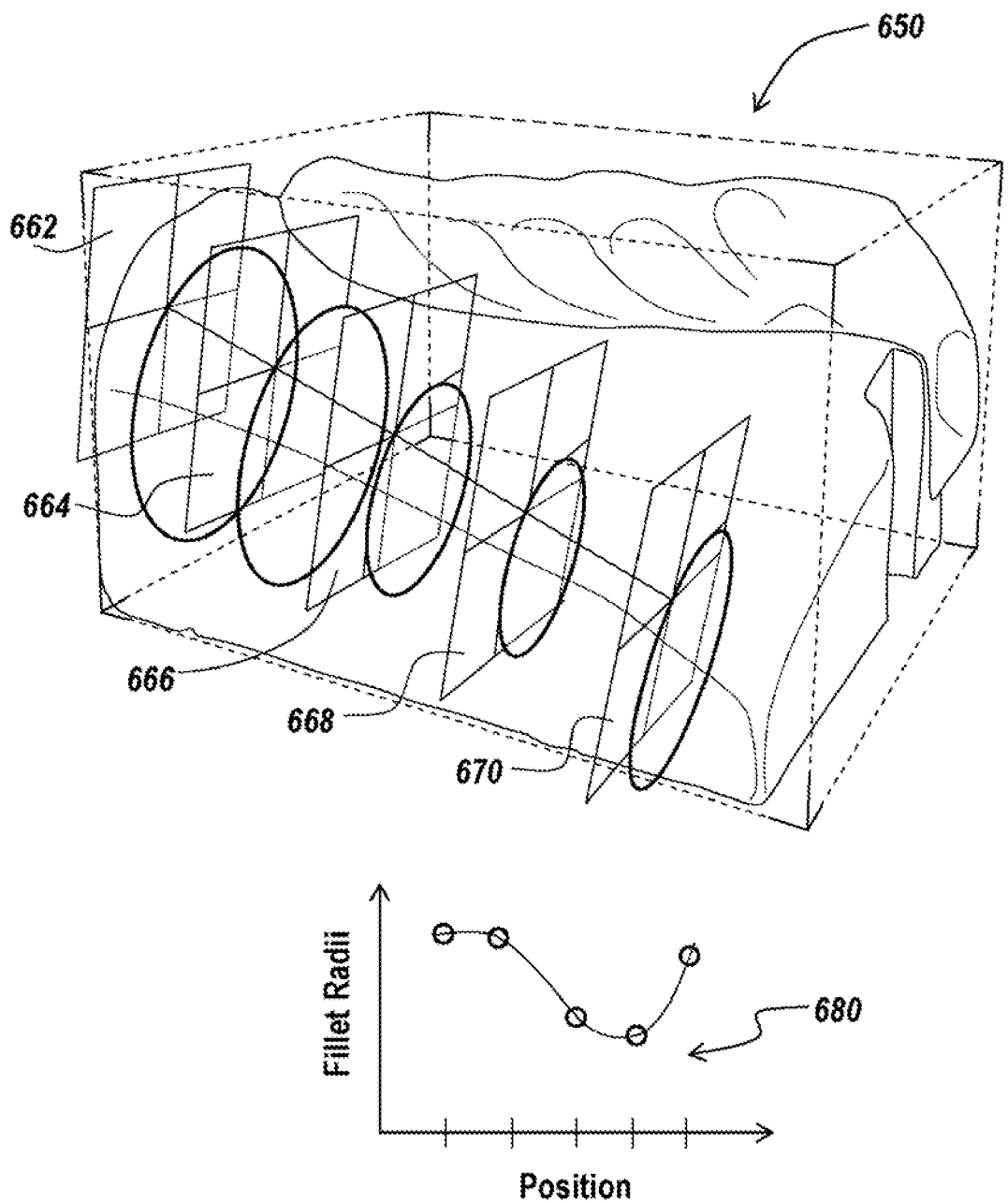
FIG. 16 depicts the filleting operation of the present invention.

The process of calculating fillet radii depicted in FIG. 16. A region of the part 650 which has a fillet is chosen. A curve is drawn on this part and planes 662, 664, 666, 668 and 670 are created perpendicular to the curve. The curve is created from interpolation by selecting a few points around the fillet. The user could choose a curve and specify the number of divisions equally distributed about the curve (as shown) or the user could choose individual points along the curve to investigate fillet radii. In FIG. 16, five sample areas are investigated to determine a fillet profile for this non-uniform fillet. The resulting radii chosen for the fillet may be the average of all fillet measurements, the max, the min, or in the case of a non-uniform filleting radii the following interpolation (as shown in the graph 680) is used as a varying radius fillet.

The present invention may be provided as one or more computer-readable programs embodied on or in one or more mediums. The mediums may be a floppy disk, a hard disk, a compact disc, a digital versatile disc, a flash memory card, a PROM, a RAM, a ROM, or a magnetic tape. In general, the computer-readable programs may be implemented in any programming language. Some examples of languages that can be used include FORTRAN, C, C++, C#, or JAVA. The software programs may be stored on or in one or more mediums as object code. Hardware acceleration may be used and all or a portion of the code may run on a FPGA or an ASIC. The code may run in a virtualized environment such as in a virtual machine. Multiple virtual machines running the code may be resident on a single processor.

Since certain changes may he made without departing from the scope of the present invention, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present invention and that the illustrations contained herein are singular examples of a multitude of possible depictions of the present invention.

We claim:

1. A method for approximating original design intents during reverse engineering using 3D scan data, comprising:
    using a computer for:
        providing a collection of 3D scan data representing the shape of a three dimensional object, the 3D scan data combined in a plurality of meshes, the plurality of meshes combined into a mesh model representing the three dimensional object;
        segmenting the mesh model with a segmentation facility into a plurality of mesh regions;
        selecting a mesh region and a design intent, the design intent being an original design feature;
        calculating programmatically a value for the selected design intent for the selected mesh region, the calculating using the 3D scan data for the selected mesh region;
        selecting a specified feature in a CAD model formed from the mesh model; and
        calculating an estimated parameter value for the specified feature using an executable software process to process the 3D scan data associated with the specified feature.

2. The method of claim 1 wherein the segmentation facility segments the mesh model into the plurality of mesh regions by estimating geometric values.

3. The method of claim 2 wherein the geometric values are one of mesh curvature values and mesh normal values.

4. The method of claim 1 wherein the plurality of meshes are one of the group of triangular meshes, quad meshes and points.

5. The method of claim 1 wherein the design intent is represented by the calculation of a vector.

6. The method of claim 5 wherein the design intent is one of an extrusion direction, parting direction, circular pattern axis, linear pattern direction, cone axis, cylinder axis and a revolving center.

7. The method of claim 1 wherein the design intent is represented by the calculation of a plane.

8. The method of claim 7 wherein the design intent is one of an orthogonal plane and a mirroring plane.

9. The method of claim 1 wherein the design intent is represented by the calculation of a poly-line.

10. The method of claim 9 wherein the design intent is one of an extrusion profile, revolving profile, sweeping path curve, center line of curved pipe, fillet center, virtual sharp edge, bead line, silhouette curve and parting curve.

11. The method of claim 1 wherein the design intent is one of a drafting angle, a constant fillet radii, a varying fillet radii, a revolving angle, an extrusion distance and a hollowing wall thickness feature.

12. A tangible physical medium for use with a computing device, the tangible physical medium holding computer-executable instructions for approximating original design intents during the reverse engineering using 3D scan data, the instructions when executed causing a computing device to:
    provide a collection of 3D scan data representing the shape of a three dimensional object, the 3D scan data combined in a plurality of meshes, the plurality of meshes combined into a mesh model representing the three dimensional object;
    segment the mesh model with a segmentation facility into a plurality of mesh regions;
    select a mesh region and a design intent, the design intent being an original design feature;
    calculate programmatically a value for the selected design intent for the selected mesh region, the calculating using the 3D scan data for the selected mesh region;
    select a specified feature in a CAD model formed from the mesh model; and
    calculate an estimated parameter value for the specified feature using an executable software process to process the 3D scan data associated with the specified feature.

13. The medium of claim 12 wherein the segmentation facility segments the mesh model into the plurality of mesh regions by estimating geometric values.

14. The medium of claim 13 wherein the geometric values are one of normal mesh values and mesh curvature values.

15. The medium of claim 13 wherein the plurality of meshes are one of the group of triangular meshes, quad meshes and points.

16. The medium of claim 12 wherein the design intent is represented by the calculation of a vector.

17. The medium of claim 16 wherein the design intent is one of an extrusion direction, parting direction, circular pattern axis, linear pattern direction, cone axis, cylinder axis and a revolving center.

18. The medium of claim 12 wherein the design intent is represented by the calculation of a plane.

19. The medium of claim 18 wherein the design intent is one of an orthogonal plane and a mirroring plane.

20. The medium of claim 12 wherein the design intent is represented by the calculation of a poly-line.

21. The medium of claim 20 wherein the design intent is one of an extrusion profile, revolving profile, sweeping path curve, center line of curved pipe, fillet center, virtual sharp edge, bead line, silhouette curve and parting curve.

22. The medium of claim 12 wherein the design intent is one of a drafting angle, a constant fillet radii, a varying fillet radii, a revolving angle, an extrusion distance and a hollowing wall thickness feature.

* * * * *